US012656509B2

(12) United States Patent
Fraczek et al.

(10) Patent No.: US 12,656,509 B2
(45) Date of Patent: Jun. 16, 2026

(54) X-RAY DETECTION DEVICE

(71) Applicant: KETEK GmbH Halbleiter—und Reinraumtechnik, Munich (DE)

(72) Inventors: Michael Darius Fraczek, Pliening (DE); Oliver Scheid, Munich (DE); Andreas Pahlke, Brunnthal (DE); Jörg Rumpff, Egling (DE)

(73) Assignee: KETEK GmbH Halbleiter—und Reinraumtechnik, Munich (DE)

( * ) Notice: Subject to any disclaimer, the term of this patent is extended or adjusted under 35 U.S.C. 154(b) by 251 days.

(21) Appl. No.: 18/538,948

(22) Filed: Dec. 13, 2023

(65) Prior Publication Data

US 2025/0199189 A1 Jun. 19, 2025

(51) Int. Cl.
| | |
|---|---|
| *G02B 27/30* | (2006.01) |
| *G01T 1/24* | (2006.01) |
| *H05K 9/00* | (2006.01) |

(52) U.S. Cl.
CPC .............. *G01T 1/244* (2013.01); *G02B 27/30* (2013.01); *H05K 9/0081* (2013.01)

(58) Field of Classification Search
CPC ....... G01T 1/244; G02B 27/30; H05K 9/0081
See application file for complete search history.

(56) References Cited

U.S. PATENT DOCUMENTS

| | | | |
|---|---|---|---|
| 7,618,906 B2 | 11/2009 | Meilahti | |
| 8,494,119 B2 | 7/2013 | Andersson | |
| 11,398,573 B2 | 7/2022 | Maynard et al. | |
| 2013/0037717 A1 | 2/2013 | Eggert | |
| 2020/0105948 A1 | 4/2020 | Maynard et al. | |
| 2022/0320353 A1 | 10/2022 | Maynard et al. | |

FOREIGN PATENT DOCUMENTS

| | | | | |
|---|---|---|---|---|
| CN | 119517710 A | * | 2/2025 | ....... G01N 23/20091 |
| WO | WO-2019117276 A1 | * | 6/2019 | ............... G01T 7/00 |

OTHER PUBLICATIONS

Research Disclosure, "Highly thermally conductive detector housing, stray line free detector, and low magnetic permeability of detector housing pins", Apr. 2019, 3 pages.
Research Disclosure, "Radiation shielding structures for X-Ray radiation detectors", Dec. 2019, 4 pages.

* cited by examiner

*Primary Examiner* — Uzma Alam
*Assistant Examiner* — Fani Polyzos Boosalis
(74) *Attorney, Agent, or Firm* — Slater Matsil, LLP

(57) ABSTRACT

In an embodiment an X-ray detection device includes a housing, an X-ray detector located in the housing and configured to detect X-rays within an energy detection range of the X-ray detector, a collimator being opaque in at least part of the energy detection range and partially covering the X-ray detector and a first shielding element being opaque in at least part of the energy detection range, wherein the first shielding element is configured to provide at least one of protection of the X-ray detector against stray X-rays within the energy detection range coming from the housing and/or from the collimator or protection of the housing and/or the collimator from at least one of the stray X-rays or other X-rays.

18 Claims, 10 Drawing Sheets

FIG 15
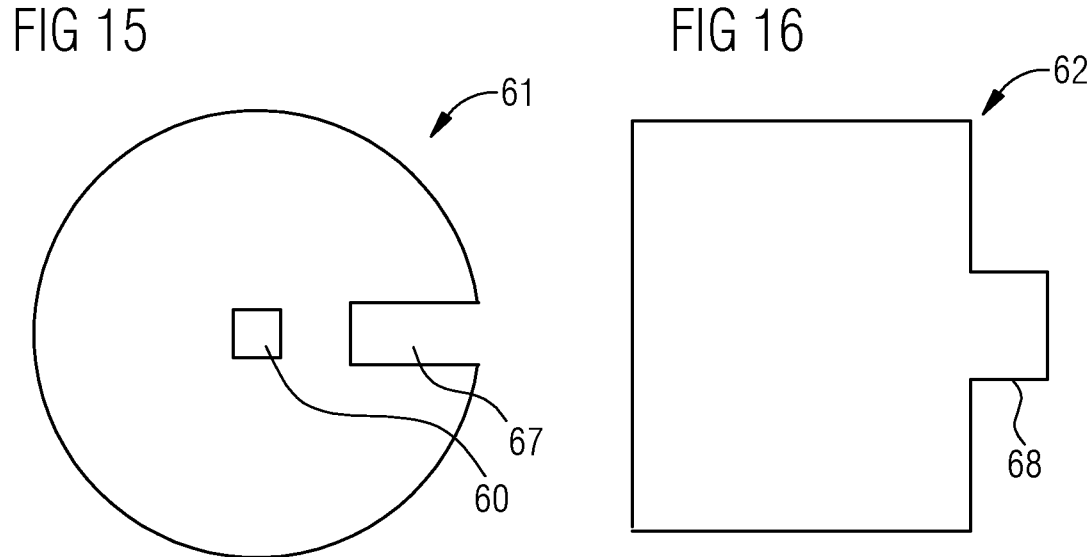
FIG 16
FIG 17
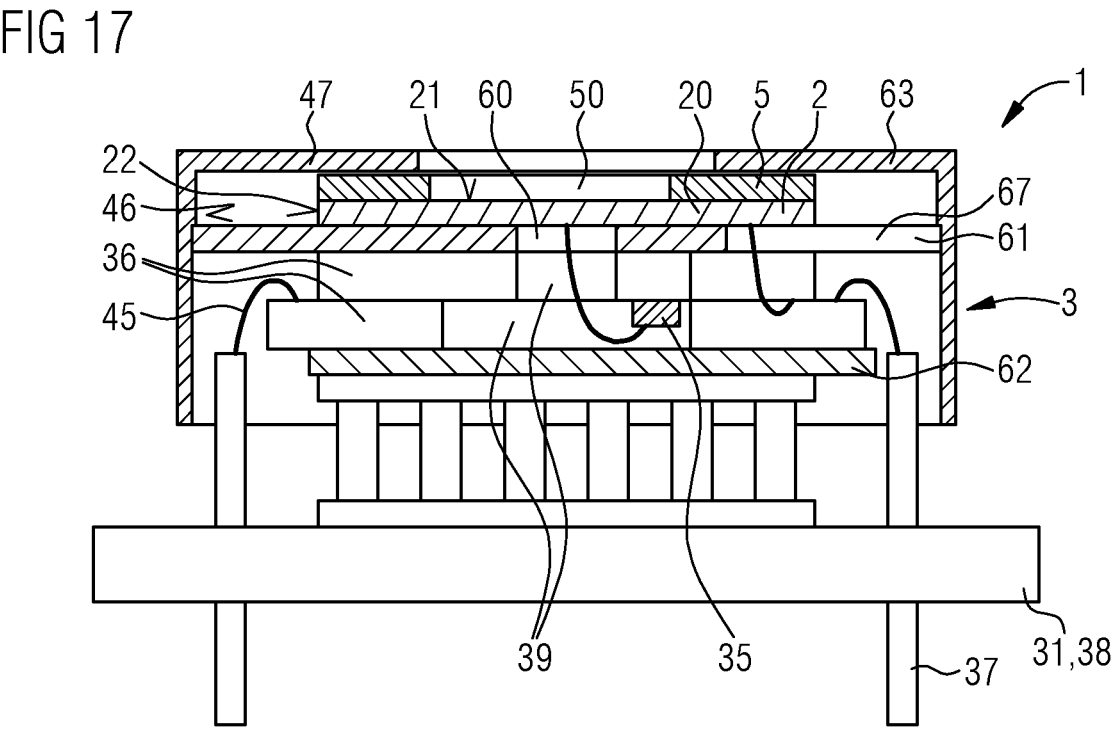

61,62,63

61,62,63

X-RAY DETECTION DEVICE

TECHNICAL FIELD

An X-ray detection device is provided.

BACKGROUND

Documents US 2020/0105948 A1, US 2022/0320353 A1 and US 2013/0037717 A1 refer to X-ray detectors.

Documents U.S. Pat. Nos. 8,494,119 B2 and 7,618,906 B2 refer to windows for X-rays.

Document "Highly thermally conductive detector housing, stray line free detector, and low magnetic permeability of detector housing pins", published in Research Disclosure, database number 660055, April 2019, ISSN 0374-4353, refers to an X-ray detector.

Document "Radiation shielding structures for X-Ray radiation detectors", published in Research Disclosure, database number 668082, December 2019, refers to an X-ray detector.

SUMMARY

Embodiments provide an X-ray detection device with improved limits of detection.

According to at least one embodiment, the X-ray detection device comprises a housing. For example, the housing provides a sealed space in which an X-ray detector is located. The housing can be composed of several components. For example, the housing includes one or more of a cap, a window, a socket, an electronic component, a circuit board, an electric feed through connection or a cooling unit. The sealed space may be evacuated or nearly evacuated or may be provided with an inert gas. The X-ray detection device may also be referred to as detector module.

According to at least one embodiment, the X-ray detection device comprises one or a plurality of X-ray detectors. The at least one X-ray detector is located in the housing. For example, the at least one X-ray detector is configured to detect X-rays. The X-rays to be detected may have a photon energy within an energy detection range of the X-ray detector. In other words, the at least one X-ray detector is configured to detect photons having energies within the energy detection range, hence, the energy detection range can be an energy range of interest. For example, the energy detection range starts below 1 keV or below 0.1 keV; alternatively or additionally, the energy detection range ends above 25 keV or above 50 keV or above 100 keV or above 0.2 MeV. It is possible that different kinds of X-ray detectors are combined with each other in the X-ray detection device.

The X-ray detector may comprise an active volume. The active volume is the region within the X-ray detector within which incident radiation is converted into electrons and then read out, for example. The X-ray detector can be a detector chip comprising at least one semiconductor material.

According to at least one embodiment, the X-ray detection device comprises one or a plurality of collimators. The at least one collimator is opaque for X-rays, especially for X-rays with energies in at least part of the energy detection range. For example, the collimator is opaque for characteristic X-rays stemming from materials the housing is made of and/or for X-rays from an excitation source of an X-ray system the X-ray detection device is used in and/or for characteristic X-rays stemming from other materials of the X-ray system. Hence, the collimator can shield the X-ray detector from radiation that may otherwise cause a signal in the X-ray detector.

According to at least one embodiment, the at least one collimator partially covers the X-ray detector. Hence, seen in top view of the X-ray detector, the collimator and the X-ray detector partially overlap.

According to at least one embodiment, the at least one collimator is partially or completely located in the housing. This may mean that the at least one collimator is enclosed in the sealed space. The at least one collimator may be mounted on the X-ray detector.

According to at least one embodiment, the X-ray detection device comprises one or a plurality of shielding elements. The at least one shielding element is opaque in at least part of the energy detection range, for example, analogously to the at least one collimator.

Thus, the X-ray detection device may be referred to as a detector module component or as a detector module that comprises or consists of the at least one X-ray detector, the at least one collimator, the housing or the at least one shielding element.

According to at least one embodiment, the at least one shielding element is located in the housing. This may mean that the at least one shielding element is enclosed in the sealed space or that the at least one shielding element is used to enclose the sealed space, together with the housing.

According to at least one embodiment, the shielding element is configured to provide protection of the X-ray detector against stray X-rays. The stray X-rays may have a photon energy within the energy detection range, for example. It is possible that the stray X-rays originate from radiation from a sample to be detected and/or are characteristic X-rays from materials the housing is made of and/or are X-rays from an excitation source of an X-ray system the X-ray detection device is used in and/or are characteristic X-rays stemming from other materials of the X-ray system; said radiation hits, for example, the housing and results in the stray X-rays. The stray X-rays may have an energy lower than said radiation and can particularly be characteristic x-rays of chemical elements the x-ray detection device is made of, see above. Hence, the stray radiation may come, for example, from at least one of the housing or the collimator. Otherwise, said radiation causing the stray X-rays may come from an excitation source or a background source.

According to at least one embodiment, the shielding element is configured to provide protection of the housing and/or the collimator from at least one of the stray X-rays or other X-rays. As stated above, the other X-rays may come from at least one of the excitation source or any background source, for example, characteristic X-rays of materials of the system the X-ray detection device is used in, or the X-rays originating from the sample to be analyzed, that is, a part of the X-rays emitted by the sample but not hitting the detector in a way to be detected.

The stray X-rays may also be referred to as stray lines or stray line radiation, that is, radiation possibly read out by the detector but originating from detector device components and not from the sample being analyzed.

In at least one embodiment, the X-ray detection device comprises a housing; an X-ray detector located in the housing and configured to detect X-rays within an energy detection range of the X-ray detector; a collimator being opaque in at least part of the energy detection range and partially covering the X-ray detector and being located in the housing, for example; and a shielding element being opaque in at least part of the energy detection range and being located in the housing, for example, wherein optionally the shielding element is configured to provide at least one of protection of the X-ray detector against stray X-rays within the energy detection range coming from the housing and/or from the collimator, or protection of the housing and/or the collimator from at least one of the stray X-rays or other X-rays.

Thus, the present application refers, for example, to a stray line free detection of X-ray radiation using a radiation detector such as PIN photodiodes or silicon drift detectors, SDDs for short.

For material analysis with x-ray detection devices, for example, a sample is exposed to X-rays and excited. The X-rays reemitted by the sample are characteristic of the sample's chemical composition. Likewise, materials of the X-ray detector device itself can be excited and emit X-rays which can interfere with the X-ray signal from the sample. For optimal sample analysis it is thus beneficial to prevent X-rays, other than those emitted by the sample, from hitting the X-ray detector and thus to mitigate the superposition of X-ray radiation originating in the sample to be analyzed and the detector module recording the radiation from that sample.

With the present device, minimization and reduction of detection of unwanted X-rays, in the following especially referred to as "stray lines", generated by components or materials an X-ray radiation detector module is made of and not by a sample to be analyzed is achieved. For this purpose, some exemplary designs and methodology of arrangements of internal components of an X-ray radiation detection device to minimize the detection of stray lines is provided.

For example, the shielding element is a structure of specific material, material combination or material layer structure each having specific thicknesses in order to block stray lines and thus preventing the stray lines entering the detector active volume and being read out. In the present context, the shielding elements can exhibit any of the following features or a combination thereof, for example. Whenever the "blocking" or "shielding" ability of radiation of a shielding structure is referred to, all these features may be valid:

The reduction of stray line radiation intensity by means of the shielding element can be due to any physical principle as, for example, absorption or scattering effects, or a combination thereof.

The shielding element can reduce the intensity of a stray line passing the shielding element. In particular, a reduction in intensity below a detection limit is aspired.

The shielding element can reduce the energy of the stray line radiation passing that structure. More precisely this means that by principle of the X-ray fluorescence, a higher energy X-ray photon passing the shielding element can be absorbed and another lower energy photon can be subsequently reemitted. Thus, by one or more absorption and subsequent fluorescence emission events of X-ray photons passing the shielding element, the mean photon energy of the predominant intensity peak inside the spectral energy distribution can shift towards smaller values. In particular, a reduction to an energy equal or smaller than that of characteristic aluminum $K_{\alpha 1}$ radiation, that is, 1.49 keV, or that of carbon $K_{\alpha 1}$ radiation, that is, 277 eV, is aspired.

In an exemplary measurement configuration, an X-ray radiation source, like an X-ray tube, is directed towards a sample to be analyzed. The X-ray radiation emitted by the source excites the atoms of the sample which hence relax and emit characteristic X-ray fluorescence radiation. That radiation is subsequently detected by an appropriate X-ray detector. The electrical signal output by the detector can then be processed and analyzed in order to obtain the elemental composition and/or structure of the sample.

In an ideal X-ray detector setup, all radiation detected by the detector would solely stem from the analyte's fluorescence radiation. In practice, this is usually not the case. Besides originating from the sample analyzed, radiation recorded by the detector may also originate from the excitation of components located around the X-ray detector like other detector module components. These components can be the module housing, parts of the housing, a radiation entrance window, solder joints, ceramic interposer boards, ceramic circuit boards, adhesives, or/and other active and passive internal components. Such excitation of these components is unintended and leads to unwanted stray lines when read by the X-ray detector. Stray lines can superimpose the characteristic X-ray radiation of the analyte, thus corrupting the elemental analysis of the analyte, which may result in higher detection limits, poor peak separation, worse elemental peak property determination, higher spectral background, systematic errors, and the like.

On the one hand, the stray line intensity and mean stray line energy can be significantly reduced by expedient choice of materials, composites, shape, composition, and arrangement of internal components of the detector. However, on the other hand, these limitations on material and design can lead to performance decrease and/or cost increase. With the module described herein, for example, by using the at least one shielding element, material and design options can be kept.

The intensity and/or mean energy of the predominant stray line radiation detected within the active volume can be partially or fully reduced by applying one or more radiation shielding elements located inside the detector housing, for example. These shielding elements can work in either of the two following modes or any combination thereof:

by blocking the stray line radiation coming from the detector module components and thus by avoiding its detection: In this constellation, the shielding element would be placed in the propagation path of a stray line to be absorbed. For example, this would be between a stray line generating component and the X-ray detector, so that the shielding element would intersect any direct connection line between parts of the detector active volume and parts of the stray line generating component.

by blocking the incident radiation before hitting a potentially stray line generating detector component: In that constellation the shielding element would be placed in front of the correspondent component in order to avoid the interaction of incident radiation with any part of that component.

By having the possibility to use shielding elements within the detector module, the choice of material composition and placement location and arrangement of internal module components becomes less critical, leading to a benefit in design variability and functionality of the whole module.

The basic properties of radiation shielding elements and the physics behind the interaction is described, for example, in document US 2013/0037717 A1, the disclosure content of which is hereby included by reference. In the detection device described herein, it is proposed to use a specific structure of consecutive layers consisting each of a single chemical element or another, for example, high purity material or material combination and having a specific thickness. The order of these layers is such that unwanted radiation is absorbed by the layer having the highest average atomic number, for example. The characteristic X-ray radiation reemitted by excited atoms of this layer is then re-absorbed by the consecutive layer having a smaller average atomic number. The thicknesses of the layers are chosen such that the residual radiation intensities transmitted by the stack of multiple layers, or just one layer, are below the detection limit for the measurement scenario or irrelevant for the analysis. Also, the energy of the radiation passing that stack of layers can be reduced to an energy which does not affect the analysis any more or is, for example, equal or below the energy of aluminum $K_{\alpha 1}$ radiation, or carbon $K_{\alpha 1}$ radiation, see above. For example, in some measurement scenarios or applications, the shielding element can consist of only one layer of a certain material of a specific thickness in order to obtain the described stray line shielding effect.

Internal module components not only can be strictly divided into shielding elements and other internal module components, but also internal components can have shielding properties and other functionalities at the same time, for example, detector housing components or a circuit board like a ceramic circuit board. Also a combination of dedicated shielding components and other functional components can lead to the desired shielding effect when radiation is passing that combination of components in series.

The geometric shape of the at least one radiation shielding element can be chosen over a wide range, taking into account the respective specific application. For example, the shielding element is located in the direct vicinity of the X-ray detector inside the detector module's housing or on the housing.

For example, stray line radiation originating from detector module components can propagate into the active volume of the X-ray detector from three different regions within the detector module. Depending on the stray line source regions, the installation locations of the shielding element or shielding elements can be chosen accordingly.

Thus, relevant stray line sources may be as follows, for example:

stray line radiation originating from a region above the X-ray detector, that is, radiation originating from a side of the X-ray detector remote from a socket and/or a circuit board may be caused by one or a plurality of the following components of the X-ray detection device: a cap of the housing; joints, like solder or adhesive joints or bonds between the cap and an X-ray window; peripheral structures of the X-ray window or the cap, like a metallization for a solder joint; stray line radiation originating from components located outside the detector housing: set-up components like sample holders, detector mounts, flanges, external beam shaping elements, external collimators, radiation entrance window protection grids, and the like, stray line radiation originating from a region below the detector chip: thermo-electric-cooler, TEC for short; circuit board and/or other boards or spacers interposed between the optional TEC and the X-ray detector and the respective materials they are made of; other active or passive functional components being mounted on these boards or on the TEC; a detector socket; getter materials and getter carrier materials; bond wires when made, for example, of gold, stray line radiation originating from a region along the side of the detector chip: detector housing, detector cap and optional surface metallization on cap walls; getter materials and getter carrier materials; bond wires.

Depending on the respective source of the stray lines, the at least one shielding element can accordingly be placed and shaped.

According to at least one embodiment, the stray X-rays originate from the housing upon being hit by at least one of the X-rays to be detected or the other X-rays. As stated above, the X-rays to be detected arrive at the detection device from a sample to be analyzed, for example. The other X-rays may be X-rays from an X-ray source to excite the sample, or may be natural or artificial X-ray background.

According to at least one embodiment, a transmittance of the shielding element for photons with energies below 30 keV or below 50 keV or below 70 keV is 5% or less or is 1% or less. For example, a lower energy limit these transmittance values are applicable to is at least 1 eV or is at least 10 eV. Said transmittance may apply throughout the stated spectral range, that is, for every wavelength in said spectral range. Thus, it is possible that a transmittance of the shielding element is 5% or less or even 3% or less or even 1% or less in at least part of the detection range of the X-ray detector.

For example, the transmittance of the shielding element has the afore-mentioned values for characteristic X-rays of materials of the housing and/or the collimator and/or the system the X-ray detection device is used in. Alternatively or additionally, said transmittance applies for radiation coming from a sample and impinging on the X-ray detection device outside the window or the detection region.

According to at least one embodiment, the X-ray detector is a semiconductor detector, like a drift detector, a Schottky diode or a PIN diode. For example, the X-ray detector is based on at least one of Si, CdTe, CdZnTe, SiC, GaAs, GaN, GaO, Ge. That is, an active region of the X-ray detector could be made of one or more of these semiconductor materials.

According to at least one embodiment, the X-ray detector is a silicon drift detector, SDD for short.

According to at least one embodiment, a thickness of the shielding element is at least 1 μm or is at least 0.01 mm or is at least 0.05 mm. Alternatively or additionally, said thickness is at most 5 mm or is at most 2 mm or is at most 1 mm.

According to at least one embodiment, the shielding element is of a single material. For example, the shielding element is made of one of the following materials: Al, C, Au, Bi, Pt, Sn, In, Sb, Ag, Fe, Cr, V, Co, Rh, Te, Ti, Si, Cu, Mo, Ni, Pd, Ta, W, Zr, Zn. For example, said material has a high purity. For example, the shielding element consists of at least 95% by mass or of at least 99% by mass or of at least 99.9% by mass or of at least 99.99% by mass of the respective material.

A shielding element or parts of the shielding elements can also consist of or comprise a polymer such as Parylene, polyimide, polyamide or polyether ether ketone, and/or consist of or comprise a ceramic material such as $Al_2O_3$, AlN, SiC, $Si_3N_4$, $B_4C$ or BN, a glass material such as quartz or fused silica ($SiO_2$), and/or a crystal like sapphire ($Al_2O_3$). All materials can be in an amorphous, polycrystalline or crystalline form.

According to at least one embodiment, the shielding element comprises a plurality of different materials. For example, the different materials are arranged in the shielding element so that an atomic number of the different materials decreases in a direction towards the X-ray detector and/or in a direction away from a center of the shielding element. In other words, the shielding element may comprise or may consist of a plurality of layers, each of the layers can be made of just one specific material, and the layers may be stacked directly on top of each other. For example, the shielding element comprises at least two materials selected from the following group: Al, C, Au, Bi, Pt, Sn, In, Sb, Ag, Fe, Cr, V, Co, Rh, Te, Ti, Si, Cu, Mo, Ni, Pd, Ta, W, Zr, Zn, $Al_2O_3$ ceramics, sapphire, $SiO_2$, quartz, fused silica, or parylenes, or the materials listed above. Concerning the purity of the respective materials, the same as in the previous paragraph can apply. Further, alloys can be used as well, for example, alloys comprising one or more of the above listed elements, as a tantalum alloy, a tungsten alloy, a bismuth alloy and/or a molybdenum alloy. Preferably, the outermost layer of the shielding element is made of elements having an atomic number or average atomic number smaller than 14, that is, equal or smaller than the atomic number of aluminum. The materials and/or layers of the shielding element can be stacked or attached to one another, for example, by means of gluing, welding, soldering, brazing, rolling and/or diffusion bonding.

According to at least one embodiment, the shielding element and the collimator are of different material compositions and/or of different layer thicknesses and/or of different layer sequences.

It is possible that the shielding element and the collimator are of completely different materials so that the shielding element and the collimator do not share a common material. Otherwise, the shielding element and the collimator may have at least one material in common and may differ in at least one other material.

According to at least one embodiment, the housing comprises a cap and at least one of a socket, a circuit board, a spacer board or a cooling unit. For example, the X-ray detector is mounted directly or indirectly on the at least one of the socket, the spacer board or the circuit board.

According to at least one embodiment, the cap comprises an opening and a window. The window closes the opening so that an enclosed space may be encased by the cap together with at least one of the socket, the spacer board, the cooling unit or the circuit board. For example, the window is transmissive for the X-rays to be detected and may be made of or may comprise a membrane of Be and/or of graphene or pyrolytic carbon or graphite or diamond or of boron or of a polymer and possibly may comprise a reinforcing structure made of, for example, a semiconductor material like silicon or a ceramics material like $Al_2O_3$ or a polymer like polyimide, polyamide or Parylene or may be based on carbon or also on a metal, like Al. For example, the window is made of elements having an atomic number smaller than 14, that is, equal or smaller than the atomic number of silicon.

According to at least one embodiment, the X-ray detector is located in the enclosed space. As stated above, the enclosed space may be evacuated.

According to at least one embodiment, the shielding element is located between the window and the collimator. For example, the shielding element is mounted on an interior side of the cap facing the collimator and can thus be distant from the collimator. Otherwise, the shielding element can be mounted on a side of the collimator facing the window and may thus be distant from the cap.

According to at least one embodiment, the shielding element is located between the X-ray detector and the at least one of the socket, the circuit board, the spacer board or the cooling element. For example, the shielding element is located on a top side of the at least one of the socket, the spacer or the circuit board, said top side facing the X-ray detector. Then, the X-ray detector may be mounted on a side of the shielding element facing away from the at least one of the socket, the spacer or the circuit board.

According to at least one embodiment, the shielding element is located at or within the at least one of the socket, the spacer board, the cooling unit or the circuit board. Thus, the shielding element can be distant from the X-ray detector. The term "at" may mean that the shielding element is applied directly on a main side of the at least one of the socket, the spacer board, the cooling unit or the circuit board.

According to at least one embodiment, the housing further comprises a cooling unit on a side of the at least one of the socket, the spacer board or the circuit board remote from the X-ray detector. Accordingly, the shielding element as well as the at least one of the socket, the spacer board or the circuit board can be located between the cooling unit and the X-ray detector. The cooling unit may be a thermo-electric cooler, TEC for short.

According to at least one embodiment, the shielding element extends for at least 30% or for at least 50% or for at least 70% or for at least 90% or for at least 95% of an overall area of the at least one of the socket, the spacer board, the cooling unit, the circuit board or the detection region or completely over the at least one of the socket and the circuit board, the cooling unit or the detection region seen in top view of the X-ray detector. Hence, the at least one of the socket, the spacer board, the cooling unit or the circuit board can nearly completely or completely be covered by the shielding element, or the shielding element nearly completely or completely extends across an area of the at least one of the socket, the spacer board, the cooling unit or the circuit board, in an interior of the at least one of the socket, the spacer board, the cooling unit or the circuit board, or the shielding element completely or nearly completely covers a back side of the at least one of the socket, the spacer board, the cooling unit or the circuit board wherein the back side faces away from the X-ray detector.

According to at least one embodiment, the X-ray detection device further comprises an additional shielding element. Concerning material composition, size, transmittance and location, the same as stated above for the shielding element may apply to the additional shielding element as well.

According to at least one embodiment, the shielding element is located between the X-ray detector and the at least one of the socket and the circuit board, and the additional shielding element is located within the at least one of the socket, the spacer board, the cooling unit or the circuit board or on the back side of the at least one of the socket, the spacer board, the cooling unit or the circuit board. Consequently, the additional shielding element can be distant from the X-ray detector. On the contrary, the X-ray detector may directly be mounted on the shielding element.

According to at least one embodiment, the shielding element has a centrally located shielding element opening and the at least one of the socket, the spacer board, the cooling unit or the circuit board has a board opening. The board opening may be located centrally in the at least one of the socket the spacer board, the cooling unit or the circuit board, seen in top view of the X-ray detector.

According to at least one embodiment, the board opening and the shielding element opening overlap partially or completely. It is possible that the shielding element opening protrudes into the board opening, seen in top view of the X-ray detector. Hence, the shielding element opening may be smaller than the board opening and may completely lie within the board opening, seen in top view. For example, an area of the shield element opening is at least 10% or at least 30% or at least 50% of an area of the board opening. Alternatively or additionally, said proportion may be at most 90% or is at most 80% or is at most 70%.

According to at least one embodiment, the additional shielding element is located on a side of the shielding element remote from the X-ray detector and distant from the shielding element. In other words, the additional shielding element can be more distant from the X-ray detector than the shielding element.

According to at least one embodiment, seen in top view of the X-ray detector, the additional shielding element completely extends across the shielding element opening. Hence, in a direction perpendicular to a radiation entrance face of the X-ray detector, there may be no straight line through the shielding element opening not running through the additional shielding element.

For example, there is no straight line from the cooling unit to the X-ray detector not running through at least one of the shielding elements.

According to at least one embodiment, the shielding element partially or completely covers side faces of the X-ray detector and/or of the collimator and/or of the at least one of the socket and the circuit board. Hence, the shielding element can be a protection against laterally arriving X-rays.

According to at least one embodiment, the X-ray detection device comprises a further shielding element. Concerning material composition, size, transmittance and location, the same as stated above for the shielding element may apply to the further shielding element as well. Thus, the shielding element may be referred to as a first shielding element and the additional shielding element may be referred to as a second shielding element and the further shielding element may be referred to as a third shielding element, with 'first' and 'second' and 'third' being used only to distinguish the shielding elements from one another, but not necessarily to indicated different technical functions or set-ups.

In at least one embodiment, the X-ray detection device comprises a housing including at least one of a socket, a spacer board, a cooling unit or a circuit board; an X-ray detector located in the housing and configured to detect X-rays within an energy detection range of the X-ray detector; a collimator being opaque in at least part of the energy detection range and partially covering the X-ray detector and being located in the housing; and a shielding element and an additional shielding element being opaque in at least part of the energy detection range and being located in the housing,
  wherein the shielding element is located between the X-ray detector and at least one of the socket, the spacer board, the cooling unit or the circuit board;
  wherein the additional shielding element is located within at least one of the socket, the spacer board, the cooling unit or the circuit board and is distant from the shielding element; and
  wherein the shielding element and the additional shielding element have different base areas, seen in top view of the X-ray detector.

For example, if there is more than one of the components the socket, the spacer board, the cooling unit or the circuit board, then the term "the additional shielding element is located within at least one of . . . " means, for example, that the additional shielding element is located within the existing ones of these components. For example, "within" means that a top side and a bottom side of a stack formed by these components and the additional shielding element are formed completely or partially by said components and not by the additional shielding element. The stack may comprise further components not listed above and the additional shielding element, or may consist of the respective, present components as listed above and the additional shielding element. The same may apply analogously for all the other embodiments.

In at least one embodiment, the X-ray detection device comprises a housing including a cap and at least one of a socket, a spacer board, a cooling unit or a circuit board; an X-ray detector located in the housing and configured to detect X-rays within an energy detection range of the X-ray detector; a collimator being opaque in at least part of the energy detection range and partially covering the X-ray detector and being located in the housing; and a shielding element and an additional shielding element being opaque in at least part of the energy detection range and being located in the housing,
  wherein the shielding element is located between the X-ray detector and at least one of the socket, the spacer board, the cooling unit or the circuit board or is located within at least one of the socket, the spacer board, the cooling unit or the circuit board and is distant from the shielding element;
  wherein the additional shielding element at least partially covers side faces of the X-ray detector and of at least one of the socket, the spacer board, the cooling unit or the circuit board; and
  wherein the additional shielding element is attached to at least one of the collimator, the cap, the shielding element, the socket, the spacer board, the cooling unit, the X-ray detector or the circuit board.

X-ray detection devices described herein are explained in greater detail below by way of exemplary embodiments with reference to the drawings. Elements which are the same in the individual figures are indicated with the same reference numerals. The relationships between the elements are not shown to scale, however, but rather individual elements may be shown exaggeratedly large to assist in understanding.

BRIEF DESCRIPTION OF THE DRAWINGS

In the figures:

FIGS. 15 and 16 show schematic top views of shielding elements of the X-ray detection device of FIG. 14;

FIG. 17 shows a schematic cross-sectional view of the X-ray detection device of FIG. 14 including some wiring;

DETAILED DESCRIPTION OF ILLUSTRATIVE EMBODIMENTS

Figure 1:
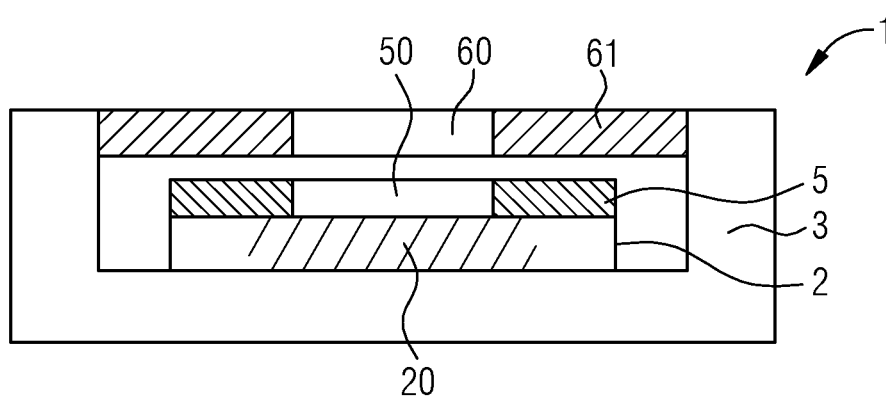
FIG. 1 shows a schematic cross-sectional view of an exemplary embodiment of an X-ray detection device described herein.
Figure 2:
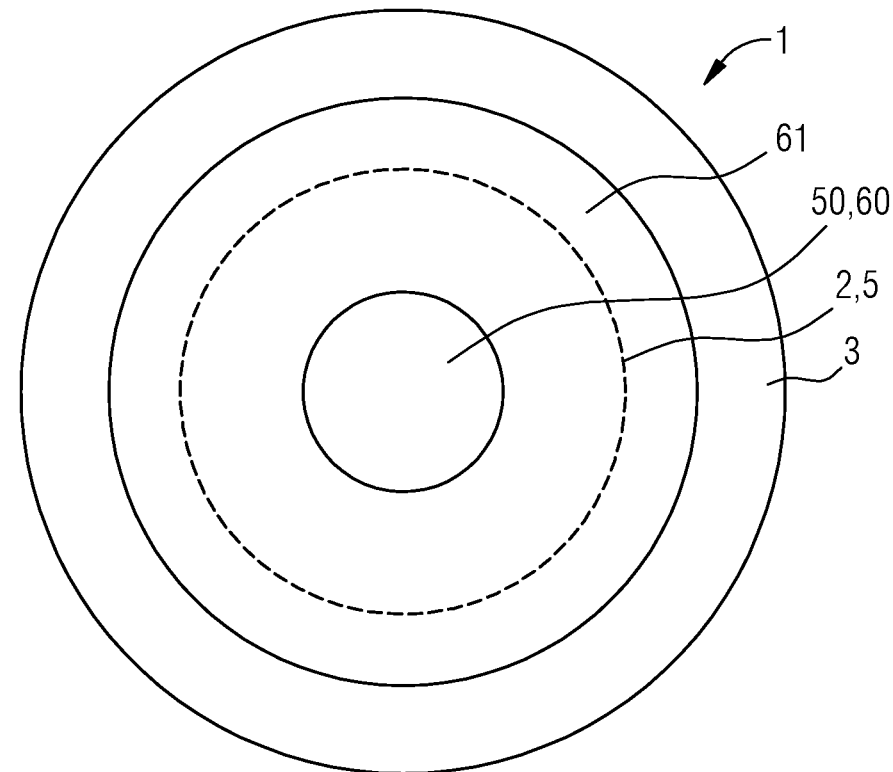
FIG. 2 shows a schematic top view of the X-ray detection device of FIG. 1.

FIGS. 1 and 2 illustrate an exemplary embodiment of an X-ray detection device 1. The device 1 comprises a housing 3. In or at the housing 3, there is an X-ray detector 2 configured to detect X-rays within an energy detection range. For example, the detector 2 is a silicon drift detector. By way of example, the energy detection range may be from at most 0.1 keV to at least 0.2 MeV.

The detector 2 has a detection region 20 in which X-rays are absorbed and transferred into an electrical signal which is output by the detector 2 to generate, for example, an energy spectrum of the detected X-rays.

The device 1 also comprises a collimator 5 located on top of the detector 2. The collimator 5 is opaque for X-rays in at least part of the energy detection range. For example, the collimator 5 covers an edge region of the detector 2. Seen in top view of the detector 2 it is possible that the detection region 20 and the collimator 5 slightly overlap. Thus, the collimator 5 has a central collimator opening 50, which is congruent or approximately congruent with the detection region 20. Despite recesses for an electric wiring, not shown in FIGS. 1 and 2, an outline contour of the detector 2 and of the collimator 5 may be congruent, too.

Further, the device 1 comprises a shielding element 61 also being opaque in at least part of the energy detection range. The shielding element 61 is configured to provide at least one of protection of the detector 2 against stray X-rays within at least part of the energy detection range coming from the housing 3 and/or from the collimator 5, or protection of the housing 3 and/or the collimator 5 from at least one of the stray X-rays or other X-rays, like the X-rays originating from the sample to be analyzed and not hitting a detection region of the X-ray detector. Possible origins of the different X-rays are discussed in more detail below in connection with FIG. 20. Especially, the stray X-rays may be characteristic X-rays from materials used in the X-ray detection device 1 so that the stray lines may stem from the X-ray detection device 1 itself, and the other X-rays may stem from outside the X-ray detection device 1.

According to FIGS. 1 and 2, the shielding element 61 is located on a side of the collimator 5 facing away from the detector 2 and distant from the collimator 5. Together with the collimator 5, the shielding element 61 narrows an angular range from which X-rays can impinge on the detector 2. That is, by using the shielding element X-rays from an angle between the two X-rays R drawn in FIG. 4 cannot reach the detector 2 anymore.

Moreover, the shielding element 61 protects large parts of the housing 3 from being hit by X-rays. The housing 3 and/or the detector 2 may be of circular shape, seen in top view; however, other shapes, like polygons or ellipses, are also possible.

Figure 3:
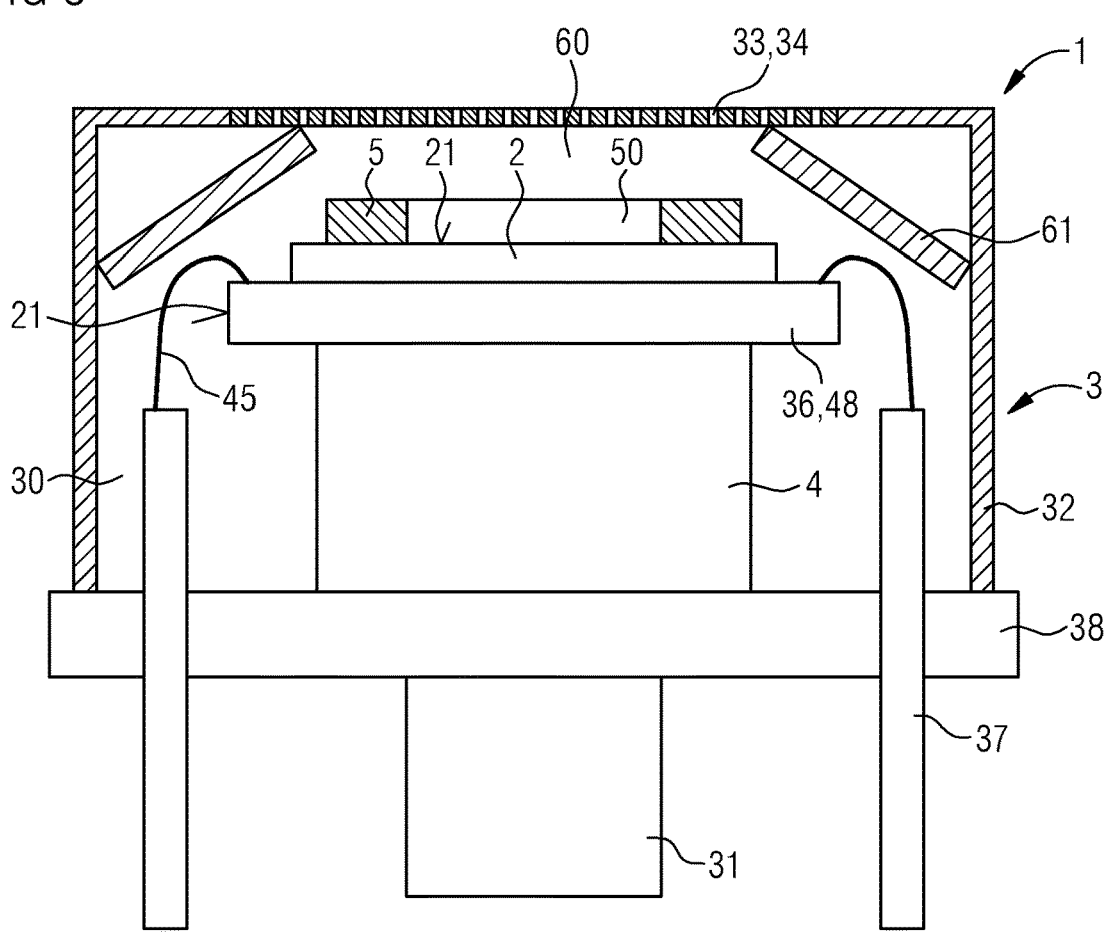
FIGS. 3 to 10 show schematic cross-sectional views of exemplary embodiments of X-ray detection devices described herein.

FIG. 3 illustrates another exemplary embodiment of the device 1. The device 1 comprises the housing 3 which is, for example, a transistor outline package, TO for short, like a TO-8. The housing comprises a housing cap 32 having an opening 33 and a window 34 that closes the opening 33. For example, the cap 32 is of at least one metal like Al, Mo, Ni, Ti, Ta, or of an alloy, like stainless steel or Kovar. However, the cap 32 can also be of any sort of ceramics such as $Al_2O_3$, ZrO, AlN and/or SiC. For example, the housing is made of non-magnetic material.

The window 34 may be made of, for example, a frameless beryllium membrane or a silicon-framed thin carbon, like pyrolytic carbon, or a polymer or a silicon nitride membrane, or of graphene, graphite, diamond, boron, boron carbide, boron nitride, or the like. Preferably, the window is made of elements having an atomic number smaller than 14, that is, equal or smaller than the atomic number of silicon. It is noted that characteristic X-ray fluorescence radiation from a window membrane or possibly from any support structure of the window 34 may be detected by the X-ray detector 2.

The collimator 5 is attached to the detector 2, preventing radiation to hit an outer region of the detection volume 20 of the detector 2, where complete charge collection is not guaranteed due to characteristics of the potential electric field inside the detection region 20.

For example, the housing 3 comprises or consists of a socket 31, like a transistor outline socket, and the cap 32 carrying the window 34 so that there is an enclosed space 30. The socket 31 can include a bottom part 38 and can also include electric feedthrough-connections 37 running through the bottom part 38.

The cap 32 and the socket 31 may be joined together or may not be joined together or may not even touch each other, for example, because the cap 32 is part of a customer system, not shown. The cap 32 has the window 34 being transmissive for the type and the energy range of the radiation to be measured by the detector 2. The window 34 is attached to the cap 32 via a joint, like a solder, braze or adhesive joint. The window 34 can be attached to the cap 32 from an outside or also from an inside. For some applications, the window 34 may be removed or even the whole cap 32 is removed.

For general operation, the socket 31 may incorporate a certain number of the electrical feedthroughs 37, like pins, electrically connecting a housing interior with other electronic components or conductor tracks outside the housing. The electrical feedthroughs 37 can be electrically isolated from the bottom part 38. Optionally, the housing 3 comprises a cooling unit 4, like a thermo-electric cooler, TEC, which may be mounted onto the socket 31, especially on the bottom part 38, in order to cool down and stabilize the detector 2 to a constant operation temperature. For example, the operation temperature of the detector 2 is below 20° C. and may range down to −90° C.

Between the cooling unit 4 and the detector 2 there can be an electric circuit board 36 of the housing 3. For example, the board 36 is made of non-outgassing materials and may have a ceramic substrate. The optional board 36 may electrically be interposed between the detector 2 and the through-connections 37 via wire bonds 45 or other technical means. Hence, electrical contact between various internal detector components and the socket pins can be established. Also other boards possibly without electric circuitry can be additionally interposed acting as spacers, component carriers, or shielding elements by themselves. Further active or passive detector components like signal amplifiers, signal and voltage filters, voltage converters, resistors, capacitors, inductors, temperature sensors, spacers and so on can optionally be mounted on these boards and/or on the cooling unit 4. An assembly direction of components on these boards can either be from a top side or the bottom side of these boards.

The exemplarily illustrated circuit board 36 may be composed of one or more plates provided with conductor tracks and/or electric components, not shown in FIG. 3. However, other than illustrated in FIG. 3, the wire bonds 45 may directly run to the detector 2. In this case, for example, instead of or in addition to the circuit board 36, one or a plurality of spacer boards 48 without electric functionality may be used. However, preferably the circuit board 36 is present, but the spacer board 48 is optional.

For the shape of such a spacer board 48, the same may apply as for the circuit board 36. Thus, by means of such a spacer board 48, a mounting platform for the detector 2 can be provided atop and distant from the cooling unit 4, for example. Also in all other embodiments, the circuit board 36 may be substituted or supplemented by such a spacer board 48.

The housing interior, that is, the enclosed space 30, if the housing 3 is hermetically sealed, is either evacuated with an exemplary residual pressure range from $10^{-8}$ mbar to $10^{-1}$ mbar or is filled with a gas of preferably low thermal conductivity for reducing heat transfer onto the detector 2 and being non-condensable at temperatures between $-90°$ C. and $200°$ C., for example. Such a gas can be, for example, Ar, Xe, $N_2$ or dry air at pressures ranging from 1 mbar to atmospheric pressure.

In the enclosed space 30, there is the shielding element 61 which has, for example, the shape of part of a truncated cone barrel. The shielding element 61 may have the shape of a jacket, for example. A cross section of the shielding element 61 can also have other shapes than illustrated. For example, the shape can be fitted to or can follow an envelope geometry of an interior of the X-ray detection device 1 and/or can be fitted to or can follow an interior shape of the cap 32, not shown in FIG. 3.

The shielding element 61 may be mounted on the cap 32 and/or on the collimator 5. Thus, the shielding element 61 can cover side faces of the detector 2 and optionally of the board 36. By means of the shielding element 61, together with the collimator 5, an effective diameter of the window 34 may be reduced. Thus, the shielding element opening 60 can be equal to or larger than the collimator opening 50, but smaller than or equal to the opening 33 in the cap 32.

Otherwise, the same as to FIGS. 1 and 2 may also apply to FIG. 3, and vice versa.

Figure 4:
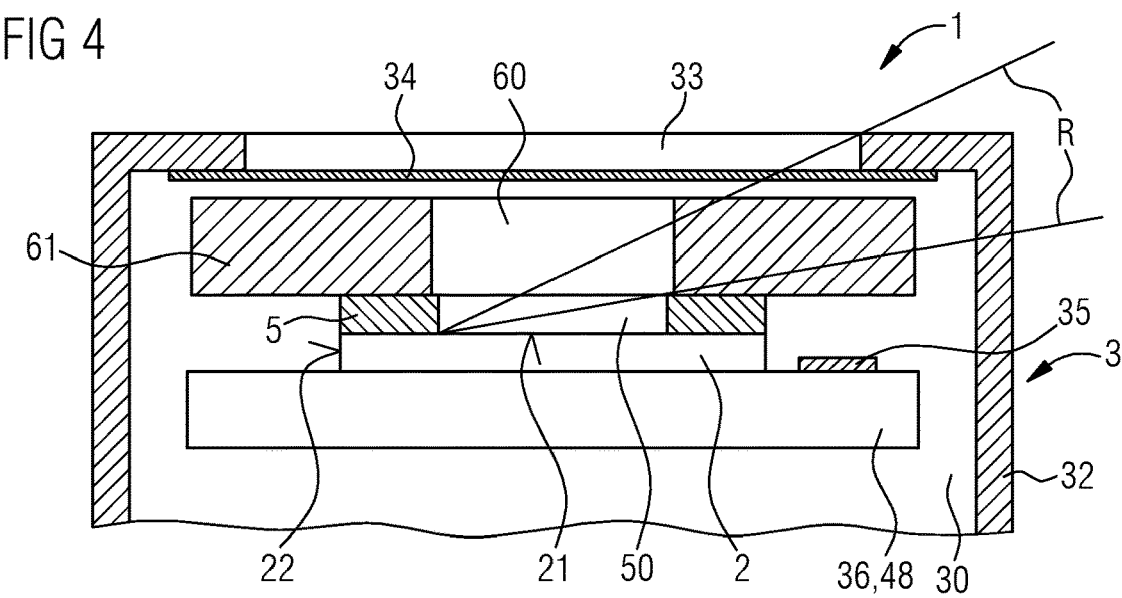
Figure 5:
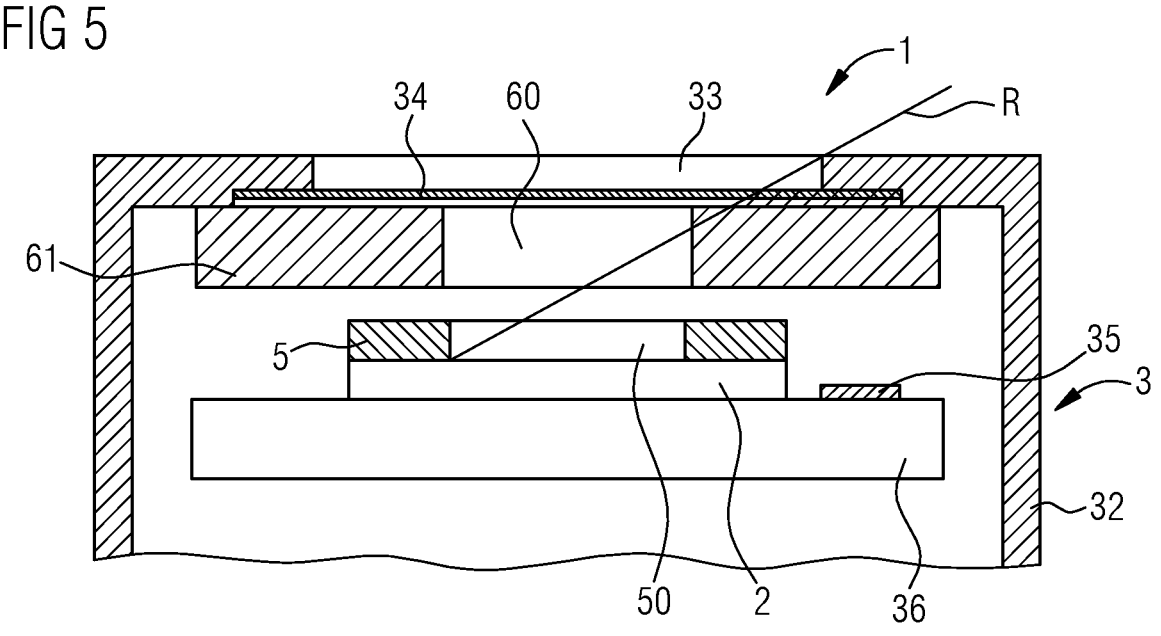

In the exemplary embodiments of FIGS. 4 and 5, the shielding element 61 is located between the collimator 5 and the part of the cap 32 carrying the window 34. An outer diameter of the shielding element 61 can be larger than an outer diameter of the collimator 5. According to FIG. 4, the shielding element 61 is attached to the collimator 5 and distant from the cap 32, and according to FIG. 5 the shielding element 61 is attached to the cap 32 or to parts of the X-ray window and is distant from the collimator 5. Side faces 22 of the X-ray detector 2 running oblique to a radiation entrance face 21 of the detector 2 may be free of the shielding element 61. The radiation entrance face 21 may run in parallel or approximately in parallel with a side of the circuit board 36 or of the spacer board 48 on which the detector 2 is mounted.

As an option, the circuit board 36 carries an electronic component 35, for example, on at least one of planar main sides of the circuit board 36, and said electronic component 35 may be prone to X-ray fluorescence. As a further option, see FIG. 5, the window 34 may be placed in a recess of the cap 32 so that the window 34 does not protrude from the cap 32. Optionally, only part of the window 34 may protrude from the cap 32. The same may apply for all other embodiments of the device 1.

Thus, in FIGS. 4 and 5 an installation location of the shielding element 61 is over the detector 2 and underneath the cap 32 and the window 34, wherein the detector 2 may be an SDD, for example. The window 34 itself can be attached either from the bottom side or from the top side to an optional flange or aperture of the cap 32, wherein the bottom side refers to the side facing the detector 2 and the top side refers to the side remote from the detector 2. The top side is particularly the radiation entrance face 21.

The inner aperture diameter of the shielding element 61, which does not need to be circular, can be smaller, equal to or larger than the corresponding diameter of the inner aperture of the collimator 5, which does not need to be circular either.

The lateral extent of the shielding element 61, which again can be but is not necessarily circular, can also be smaller than or equal to the lateral extent of the collimator 5, other than shown in FIGS. 4 and 5. For example, the outer extent of the shielding element 61 can be chosen such that, for example, the components 5, 35, 36, 48 located underneath the shielding element 61 are prevented from being hit and excited by radiation coming from above, for example, through the opening 33.

The geometrical dimensions including the thickness of the shielding element 61 may be chosen such that the shielding element 61 geometrically blocks most or all of oblique stray line radiation originating from components above the detector 2, like originating from the top side of the cap 32 or a joint between the cap 32 and the window 34.

Otherwise, the same as applies to FIGS. 1 to 3 may also apply to FIGS. 4 and 5, and vice versa.

Figure 6:
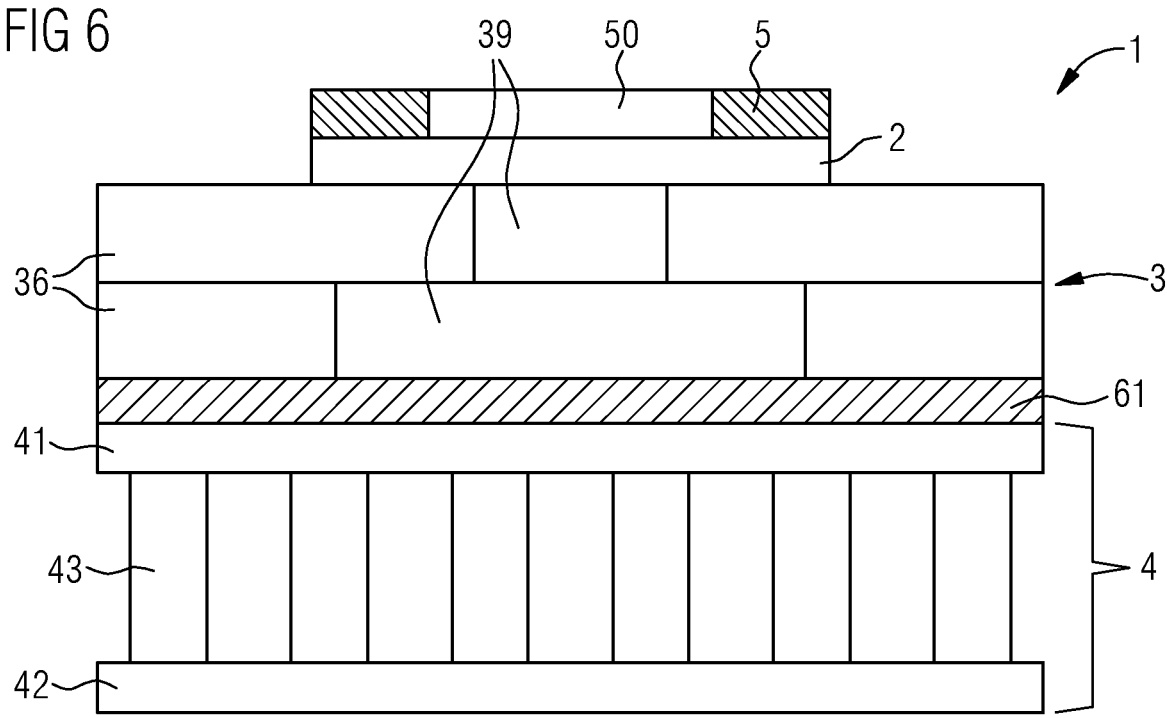

According to FIG. 6, the device 1 further comprises the cooling unit 4. For example, the cooling unit 4 is composed of an upper, first plate 41 and a bottom, second plate 42 between which a plurality of thermo-electric pellets or stacks 43 of columnar shape are placed. The cooling unit 4 can also be composed of more than one of such stages, for example, having at least two or at least three and/or having at most ten or at most five cooling stages typically located one above the other. The shielding element 61 is applied on the first plate 41 and at least completely extends across the first plate 41. Alternatively, the shielding element 61 is applied on the first plate 41 and at least covers the area of the detection region 20, seen in a top view, not shown here.

Thus, the shielding element 61 is located between the cooling unit 4 and the circuit board 36. The circuit board 36 is based, for example, on a ceramic provided with metallic conductor tracks. Moreover, the circuit board 36 is optionally a composite circuit board comprising two or more than two sub-circuit boards stacked on one above, the sub-circuit boards of the stack may have a same outline wherein the sub-circuit boards can have circuit board openings 39 of different diameters and/or expansion. For example, the circuit board openings 39 become larger in a direction away from the detector 2. Through these circuit board openings 39, electrical connections may be led from the detector 2 to sides of the circuit boards 36 remote from the detector 2, not shown. Additionally or alternatively, the optional two or more than two sub-circuit boards stacked on one above may have different outlines, seen in top view, in such a manner that the sub-circuit board most distant from the detector 2 has the largest lateral expansion. Other than shown, a circuit board 36 of single-layer fashion, that is, without sub-circuit boards, can also be used. The same applies for all other embodiments.

Hence, in FIG. 6 the installation location of the shielding element 61 is between the very bottom of the interposed board 36 and the thermo-electric cooling unit 4. Other than shown in FIG. 6, it is equally possible that the shielding element 61 is located between two interposed layers of the board 36. In other words, the shielding element 61 can be located distant from the cooling unit 4 and inside the circuit board 36. In the latter case, the shielding element 61 may extend all across the cooling unit 4 as a closed layer or may otherwise have the at least one shielding element opening 60, similar to what is shown in FIG. 2, and/or may overlap all across the area of the detection region 20, seen in top view. Optionally, said opening 60 does not necessarily need to be centered to the middle of the shielding element 61 nor have a circular shape. Optionally, the shielding element 61 may also feature more than one opening 60.

Thus, the shielding element 61 can extend over a whole footprint area of the whole cooling unit 4 and alternatively or additionally over the whole detection region 20 of the detector 2.

Figure 7:
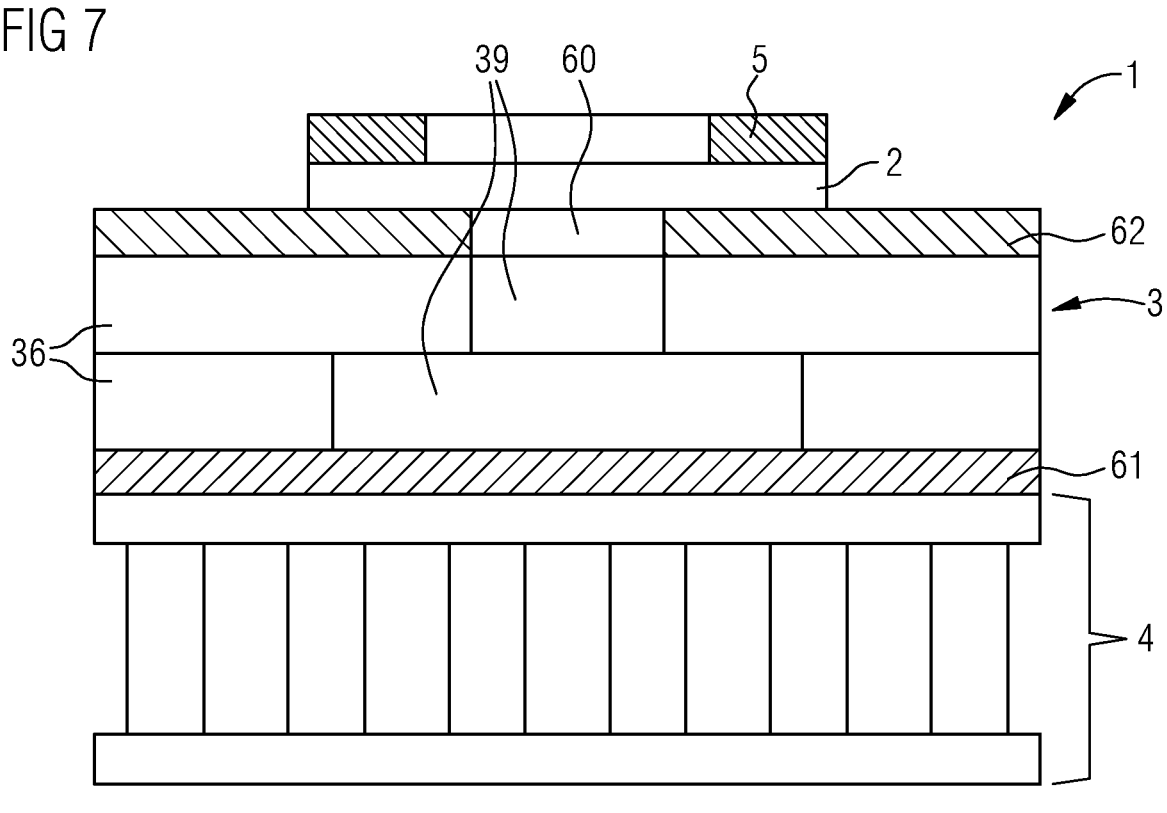

As shown in FIG. 7, there is an additional shielding element 62 at a top side of the circuit board 36. Thus, the X-ray detector 2 can be mounted on the additional shielding element 62. The additional shielding element 62 can protect the circuit board 36 from X-rays causing florescence of the circuit board 36 or the cooling unit 4 or other components, for example. Alternatively or additionally, the shielding element 62 can protect the X-ray detector 2 and/or the detection region 20 from fluorescence of the circuit board 36, the cooling unit 4 or other module components installed underneath the shielding element surface and/or side more distant from the X-ray detector. It is possible that the additional shielding element 62 completely covers the top side of the circuit board 36. As in FIG. 6, the circuit board 36 can be a stack of sub-circuit boards or can also be, other than shown, a single-layer circuit board.

In FIG. 7 it is shown that the additional shielding element 62 has an opening 60 with a same diameter as the circuit board opening 39. Contrary to that, in FIG. 8 the opening 60 of the additional shielding element 62 is smaller than the smallest circuit board opening 39. Accordingly, the detector 2 of FIG. 8 can better be protected from X-rays coming from the circuit board 36 or possibly from the cooling unit 4 than in FIG. 7.

Figure 8:
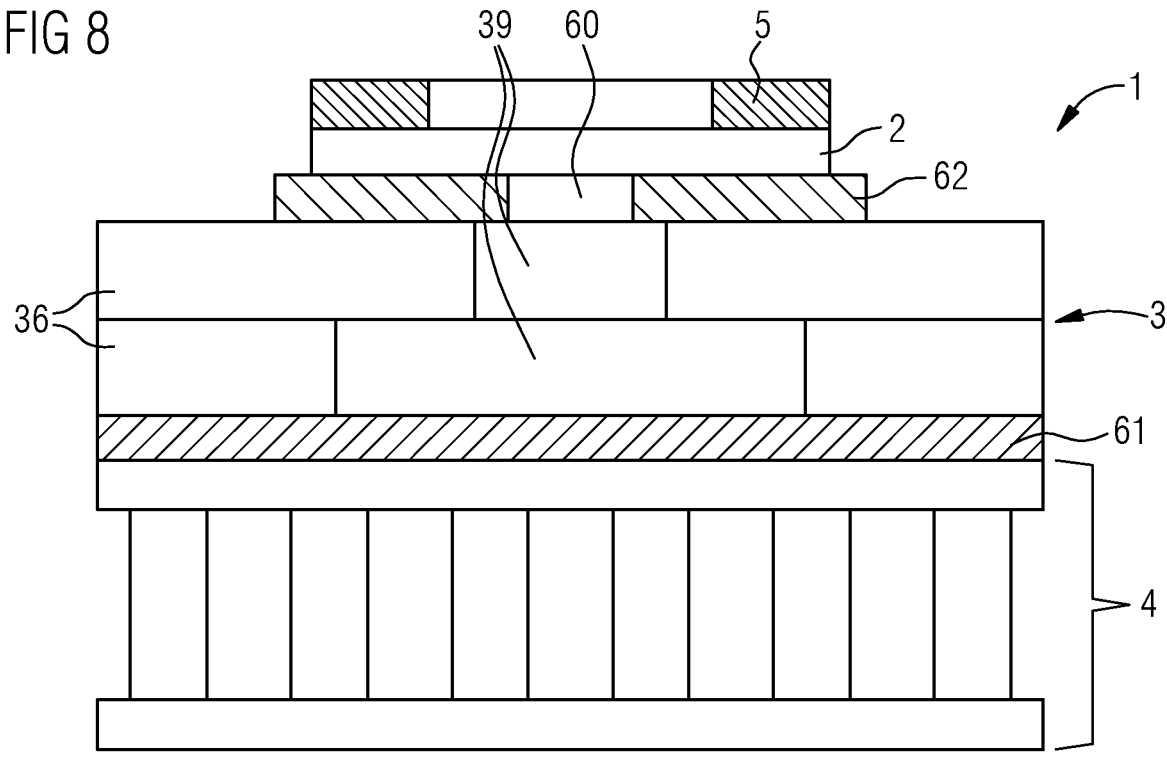

Moreover, in FIG. 8 it is illustrated that optionally the additional shielding element 62 covers only part of the top side of the circuit board 36 but may at least laterally extend completely across the detection region 20, for example. It is possible that the additional shielding element 62 laterally protrudes from the detector 2.

Otherwise, the same as to FIGS. 1 to 5 may also apply to FIGS. 6 to 8, and vice versa.

Figures 9, 10:
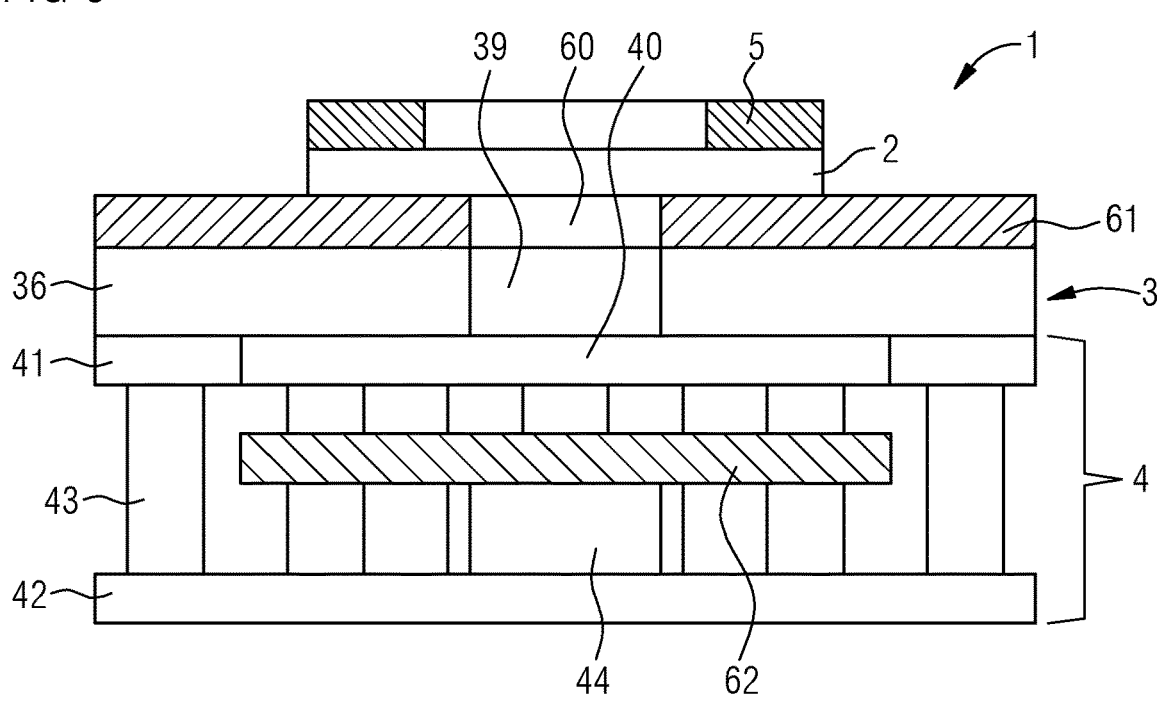

In FIGS. 9 and 10 it is illustrated that the shielding element 61 is located at the top side of the circuit board 36 which is, for example, of single-layer fashion. The cooling unit 4 may optionally be of circular or rotationally symmetric fashion, that is, the stacks 43 are arranged on a circle or a polygon such as a square or a rectangle. For example, the first plate 41 is annular. The second plate 42 may be annular or may be a hole-free plate. Hence, at least in the first plate 41 there is a cooling unit opening 40 around which the stacks 43 are arranged, seen in top view, compare also the sectional view of FIG. 11 on the dash-dotted line of FIG. 10.

The additional shielding element 62 is located between the stacks 43, for example, on top of an optional spacer 44 applied on the second plate 42. Thus, because of the shielding elements 61, 62 there is no direct line of sight for X-rays between the cooling unit 4 and the X-ray detector 2 or the detector detection region 20.

In FIG. 10 it is additionally illustrated that as options the shielding element 61 and/or the circuit board 36 may have diameters or footprints different from the cooling unit 4 so that the shielding element 61 and/or the circuit board 36 can be larger or smaller than the cooling unit 4, seen in top view. Moreover, in FIG. 10 it is illustrated that the circuit board 36 may be of stepped multi-layer fashion as well, similar to FIGS. 6 to 8, for example.

Figure 11:
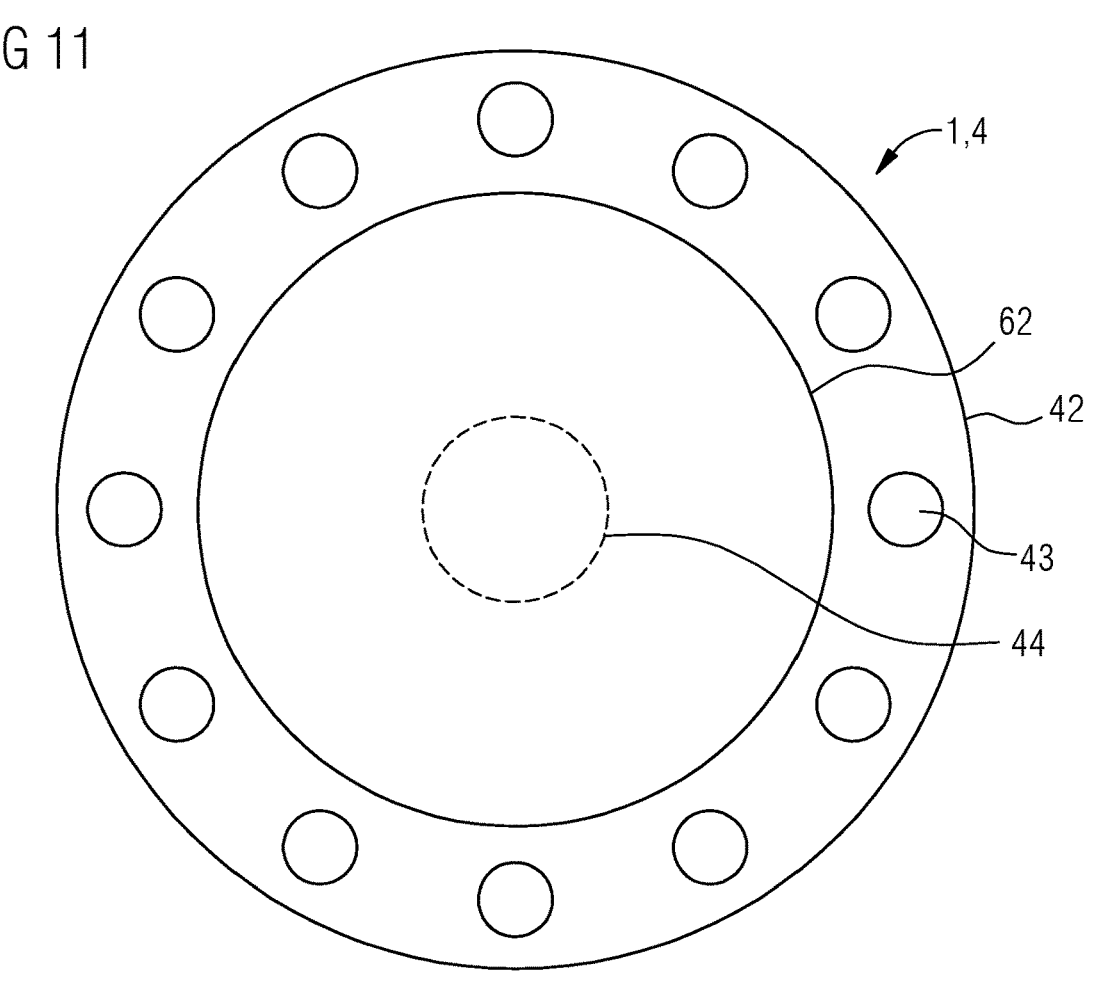
FIG. 11 shows a schematic lateral cross-sectional view of the X-ray detection device of FIG. 10.

Otherwise, the same as applies to FIGS. 6 to 8 may also apply to FIGS. 9 to 11, and vice versa.

Thus, the installation location of the shielding element 61, 62 can be below the detector 2 and above the interposed board 36, like the additional shielding element 62 in FIG. 7. In this case, the shielding element 62 covers, for example, at least the whole bottom surface of the detector 2, but at least the detection region 20 of the detector 2. The shielding element 62 may have one or more openings 60 in order to allow for electrically contacting a bottom side of the detector 2 facing the circuit board 36.

Alternatively or additionally, one of the shielding elements 61, 62 is on another height level below the shielding element 61, 62 directly at the X-ray detector 2, possibly between the stacks 43 or between the circuit board 36 and the cooling unit 4 or within the circuit board 36, which can be of multi-layer fashion. Using a combination of such shielding structures may improve the cumulative effectivity of stray line radiation blocking.

This means, for example, that the transmission of stray line radiation through the openings of shielding elements can additionally be reduced by applying a further shielding element on another height level inside the circuit board below the X-ray detector 2 and below the installation location of the shielding element next to the detector 2. The further shielding element may geometrically at least partially cover the area of the opening 60 of shielding elements closer to the X-ray detector 2.

The shielding elements 61, 62 in the devices 1 of FIGS. 6 to 11 located below the detector 2 can of course be combined with the shielding elements 61 of FIGS. 1 to 5 located atop the detector 2.

Figure 12:
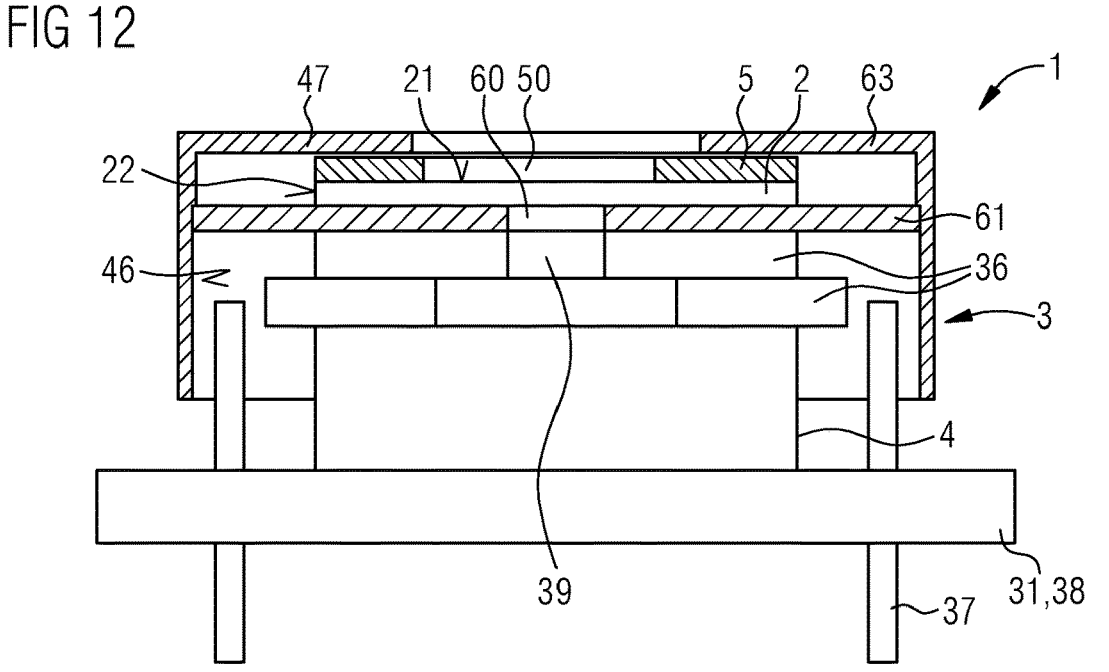
FIGS. 12 and 13 show schematic cross-sectional views of exemplary embodiments of X-ray detection devices described herein.
Figure 13:
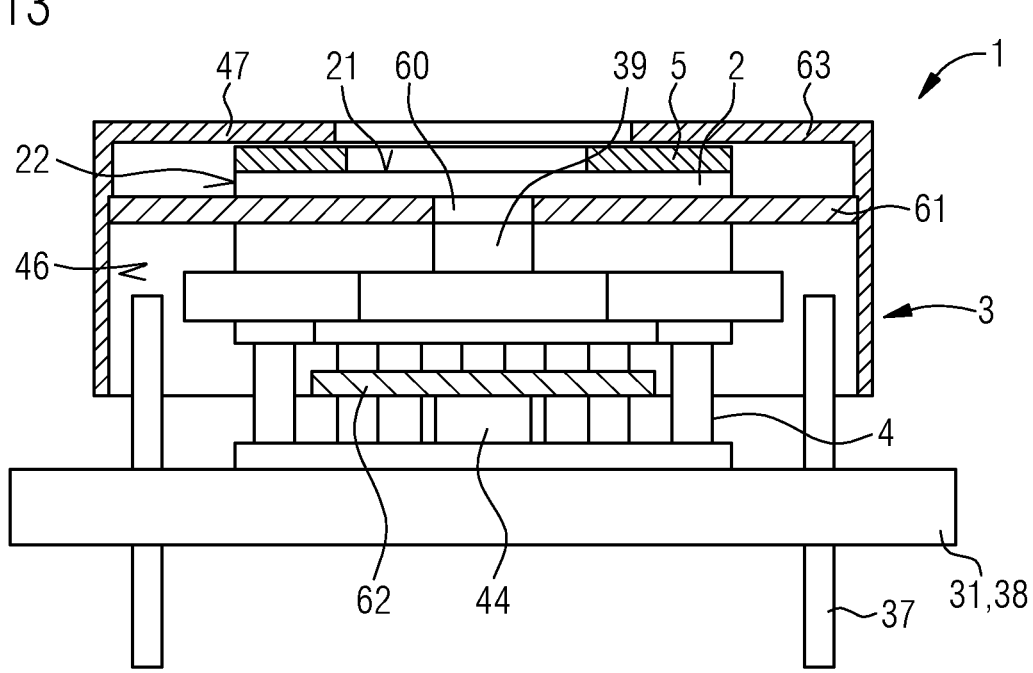

In the exemplary embodiments of FIGS. 12 and 13, there is a further shielding element 63. The further shielding element 63 is shaped cup-like and has inward lateral faces 46 facing the detector 2, the circuit board 36 and the optional cooling unit 4. These inward lateral faces 46 can be oriented oblique relative to the radiation entrance face 21 of the X-ray detector 2 facing away from the circuit board 36. Hence, the further shielding element 63 may have the shape of a cylinder jacket with the inward lateral faces 46 and provided with a top side 47 having an opening aligned with the collimator opening 50, for example. The further shielding element 63 may be a ferrule inserted into the cap, the cap is not shown in FIGS. 12 and 13.

As an option, the further shielding element 63 is attached to the housing cap 32 and/or the radiation window 34. Also as an option, the further shielding element 63 is physically part of the housing cap 32 or the housing cap 32 itself acts as the further shielding element 63. The further shielding element 63 may be distant from the cap 32 so that the cap 32 and the further shielding element 63 may not touch each other.

Moreover, optionally there is the shielding element 61 at the top side of the circuit board 36. The shielding element 61 may comprise the opening 60.

As a further option, in FIG. 12 it is shown that the further shielding element 63 does not need to be in contact with the socket 31, 38, however, other than shown the further shielding element 63 may reach down to the socket 31, 38 and may optionally touch the socket.

According to the exemplary embodiment of FIG. 13, there are not only the shielding element 61 and the further shielding element 63, but also the additional shielding element 62.

Otherwise, the same as applies to FIGS. 1 to 11 may also apply to FIGS. 12 and 13, and vice versa. Of course, the shielding elements 61, 62 in the devices 1 of FIGS. 1 to 11 located below or atop the detector 2 can be combined with the further shielding elements 63 of FIGS. 12 and 13 located laterally around the detector 2.

Thus, the installation location of the further shielding element 63 can be completely or partially around the detector 2 and attached to the shielding element 61 next to the detector 2, for example, so that the further shielding element 63 is possibly located all around the detector 2.

Alternatively or additionally, the further shielding element 63 can be attached to the interposed board 36, not shown in the drawings. Further alternatively or additionally, the further shielding element 63 can be attached to the cooling unit 4, not shown in the drawings. Further alternatively or additionally, the further shielding element 63 can be attached to the X-ray detector 2, not shown in the drawings. Further alternatively or additionally, the further shielding element 63 can be attached to the collimator 5, not shown in the drawings.

Further alternatively or additionally, the further shielding element 63 can be attached to the window 34, not shown in the drawings. Further alternatively or additionally, as stated above, the further shielding element 63 can be attached to the socket 31, 38, not shown in the drawings. In all these installation locations, it is possible that the further shielding element 63 completely or partially runs around the detector 2, seen in top view.

For example, the further shielding element 63 can be a cylinder and may be made of one or more parts.

The further shielding element 63 located around and possibly partially atop the detector 2 may intersect with a lateral plane of the detector 2 and may extend vertically at least over an entire detector height. Larger vertical expansion may be beneficial with regard to shielding effectivity. Thus, in a direction perpendicular to the radiation entrance face 21, the further shielding element 63 may extend beyond the side faces 22 away from the socket 31, 38 and/or towards the socket 31, 38.

As a further option, the further shielding element 63 along the side faces 22 of the X-ray detector 2 and the shielding element 61 atop the collimator 5, compare FIGS. 1 to 5, can be combined and either be made of one part or can consist of more than one part. For example, such a combined element 61, 63 may be composed of a cylinder jacket and two perforated disks.

In particular, the different shielding elements 61, 62, 63 do not need to be made of the same material or material combinations, and may have different layers, layer sequences or layer thicknesses. Neither do they need to be physically attached to each other nor touch each other.

A further exemplary embodiment of the device 1 is illustrated in FIGS. 14 to 17. The device 1 of these Figures also includes the first shielding element 61 between the X-ray detector 2 and the circuit board 36 which can again be a stack of sub-circuit boards. An outline of this shielding element 61 essentially corresponds to an interior footprint of the further shielding element 63. For example, the further shielding element 63 comprises a step on the inward lateral face 46, and the first shielding element 61 sits on said step. Hence, the further shielding element 63 can be mounted on the first shielding element 61.

Figure 14:
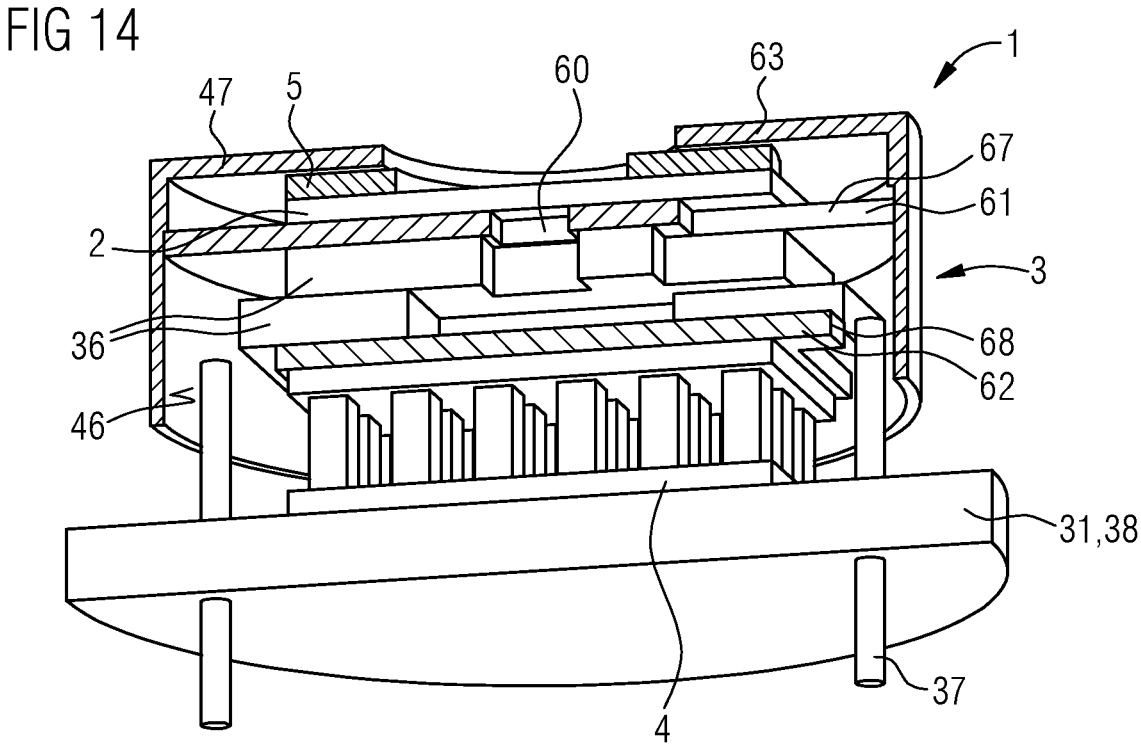
FIG. 14 shows a schematic perspective cross-sectional view of an exemplary embodiment of an X-ray detection device described herein.

In addition to the central opening 60, optionally the shielding element 61 further comprises a recess 67 starting from an edge of the shielding element 61 and running towards the central opening 60, see especially FIGS. 14 and 15. It is possible that the shielding element 61 and the cap 32 and/or the further shielding element 63 have a same basic shape, like both being circular or hexagonal, or have different basic shapes, like the cap 32 and/or the further shielding element 63 being circular and the shielding element 61 being hexagonal, seen in top view. The recess 67 may be configured for an electric wiring between the circuit board 36 and the detector 2, for example.

The central opening 60 may be of square shape, but can also be polygonal, circular, rounded, ellipsoid, or the like. For example, an area proportion of the central opening 60 relative to the interior footprint of the cap 32 and/or of the further shielding element 63 is at most 10% or is at most 3% or is at most 1%. Thus, the opening 60 can be relatively small. The opening 60 may be smaller than the opening in the layer of the circuit board 36 next to the detector 2.

The recess 67 has a length of, for example, at least 5% or at least 10% of a mean diameter of the interior footprint of the cap 32 and/or of the further shielding element 63. This value can alternatively or additionally be at most 45% or at most 35% of the mean diameter. If the interior footprint is circular, the mean diameter corresponds to the diameter, otherwise the mean diameter is $(4 \, A/\pi)^{0.5}$ with A being the area content of the interior footprint.

Instead of the recess 67 and/or in addition to the central opening 60, there can be further openings and/or further recesses, not shown in FIG. 15.

Further, the device 1 comprises the additional, second shielding element 62. The shielding element 62 is placed between the cooling unit 4 and the circuit board 36 and may completely cover the cooling unit 4. The shielding element 62, see especially FIG. 16, is in general of rectangular shape and has optionally a protrusion 68. However, other shapes of the shielding element 62 are also possible. The optional protrusion 68 may extend between the electric pins. For example, an area proportion of the protrusion 68 on an overall footprint of the shielding element 62 is at most 20% or is at most 10% or is at most 3%. For example, the protrusion 68 is located below the recess 67 so that by means of the protrusion 68 there is no direct line of sight between the detector 2 and the cooling unit 4 and/or the electric through-connections 37, for example.

Seen in top view of the detector 2, the central opening 60 lies completely over the second shielding element 62, and the recess 67 in the first shielding element 61 lies completely or predominantly over the protrusion 68. The circuit board 36 can have a corresponding recess which is at least partially congruent with the recess 67 and the protrusion 68. The electric through-connections 37 may be placed outside the recess 67 and the protrusion 68, seen in top view of the detector 2.

Thus, there may be no direct line of sight from at least one of the electric through-connections 37, the cooling unit 4, the socket 31, 38 and/or the circuit board 36 to the detector 2 because of the shielding elements 61, 62. For example, there is no direct line of sight between any of the electric through-connections 37, the cooling unit 4, the socket 31, 38 and the circuit board 36 to the detector 2. Optimally, because of the shielding elements 61, 62, 63 together there is no direct line of sight for X-rays between the housing 3, especially the cap 32 and the cooling unit 4, and the X-ray detector 2 or the detection region 20. Hence, the detector 2 can efficiently be protected from X-rays coming from the afore-mentioned components of the device 1.

As a further option, the third shielding element 63 may only have the top side 47 but no side walls. That is, the third shielding element 63 may be of annular shape, similar to what is shown in FIGS. 4 and 5. In this case, the side faces 22 of the detector 2 may not be covered by any one of the shielding elements 61, 62, 63 or the collimator 5, but an outer region of the detector 2 surrounding the detection region 20 may function as a radiation shield as in the outer region X-rays can be absorbed and consequently do not reach the detection region 20. Hence, a radiation shield for the side faces 22 may be omitted.

By means of the opening 60 and the recess 67, it is possible to efficiently connect the top side of the detector 2 facing the window 34 and/or a bottom side of the detector 2 facing the circuit board 36 with the one or the plurality of electric components 35 at the bottom of the topmost layer of the circuit board 36 and/or directly with the topmost layer of the circuit board 36. This electrical connection is done, for example, by means of the wire bonds 45. For example, the lowermost layer of the circuit board 36 is then connected with the electric through-connections 37, for example, by means of the wire bonds 45, see especially FIG. 17.

Hence, using the shielding elements 61, 62 allows for efficient electrical contacting of the detector 2 while sufficient radiation shielding is ensured.

Other than shown in FIGS. 14 to 17, the device 1 may optionally further comprise the further, third shielding element 63 as illustrated in connection with FIGS. 12 and 13, and the second shielding element 62 may optionally be placed between the stacks 43 of the cooling unit 4, as shown in FIG. 9, 10 or 13, for example.

Otherwise, the same as applies to FIGS. 1 to 13 may also apply to FIGS. 14 to 17, and vice versa.

Accordingly, all the various shielding elements 61, 62, 63 can be used individually or simultaneously in any combination with other shielding elements 61, 62, 63, and there is no limitation in the number of shielding elements so that there can be more than two or more than three of the shielding elements 61, 62, 63. For example, the shielding elements can be made of more than one part and may be made of the same or also of different materials or a combination of materials and material structures, like multi-layer systems. The shielding elements 61, 62, 63 do not need to be physically attached to each other nor touch each other.

Figure 18:
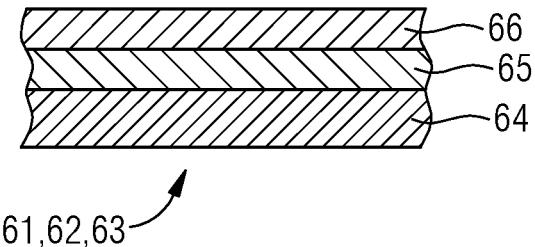
FIGS. 18 and 19 show schematic cross-sectional views of exemplary embodiments of shielding elements for X-ray detection devices described herein.
Figure 19:
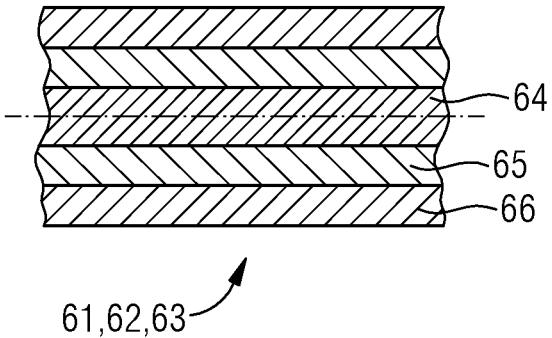

In FIGS. 18 and 19, two examples of multi-layer shielding elements 61, 62, 63 are schematically illustrated. Other than shown in FIGS. 18 and 19, the shielding elements 61, 62, 63 can alternatively be of only a single material, like Al, C, Au, Bi, Pt, Sn, In, Sb, Ag, Fe, Cr, V, Co, Rh, Te, Ti, Si, Cu, Mo, Ni, Pd, Ta, W, Zr, Zn, $Al_2O_3$ ceramics, sapphire, $SiO_2$, quartz, fused silica, or parylenes.

According to FIG. 18, the shielding element 61, 62, 63 comprises the three layers 64, 65, 66, wherein the layer 64 corresponds to a core and is made, for example, of pure Ta, W, Au or Bi. The intermediate layer 65 is made, for example, of pure Cr, Ni, Cu, Fe or Ti. The outer layer 66 may be made of pure Si, Al, C, ceramics such as $Al_2O_3$, AlN, BN, $B_4C$, SiC, $Si_3N_4$, a glass such as quartz or fused silica of $SiO_2$, a crystal such as sapphire of $Al_2O_3$ or of a polymer such as polyimide, polyamide, polyether ether ketone or parylene. Thus, the atomic number or the average atomic number of the material of the individual layers 64, 65, 66 may increase towards the core 64. The layers 64, 65, 66 may all be of the same or also of different thicknesses. It is possible that the shielding element 61, 62, 63 comprises more than three of the layers. Preferably, the outermost layer of the shielding element is made of elements having an atomic number or an average atomic number smaller than 134, that is, equal or smaller than the atomic number of aluminum.

In case of the further shielding element 63 of FIGS. 12 to 14 and 17, for example, the outer layer 66 is next to the detector 2 and the core 64 is next to the cap 32. The cap 32 may partially or entirely be replaced by the further shielding element 63. The same may analogously apply to the shielding element 61 of FIGS. 1 to 5.

Although shown to be of plane fashion, the shielding elements 61, 62, 63 can also be of bent shape, for example, when applied on the inward lateral faces 46 of the cap 32.

Otherwise, the same as to FIGS. 1 to 17 may also apply to FIG. 18, and vice versa.

According to FIG. 19, the shielding element 61, 62, 63 is of symmetrical configuration having a plane of symmetry, indicated by a dash-dotted line, which may run through the core 64. Such a shielding element 61, 62, 63 may be used, for example, for the shielding elements 61 and/or 62 of any one of FIGS. 6 to 17. Amongst others, due to the symmetrical design temperature induced bimetal effects can be minimized. The number of layers may differ from what is illustrated in FIG. 19.

Otherwise, the same as applies to FIG. 18 may also apply to FIG. 19, and vice versa.

Thus, the described shielding elements 61, 62, 63 could be, for example, a stack of layers with thicknesses between 1 μm and 5 mm each consisting in large part of pure chemical elements like tungsten, tantalum, gold, platinum, nickel, chromium, titanium, aluminum, carbon and/or boron. The layers 64, 65, 66 may also comprise or consist of a mixture of chemical elements, ceramics or polymers like Parylene. Highly pure ceramics like $Al_2O_3$ or AlN, or crystals like sapphire, or glasses like quartz or fused silica, could also be used for the shielding elements 61, 62, 63.

This applies to all the embodiments of the shielding elements 61, 62, 63.

Further, for the shielding elements 61, 62, 63 the disclosure content of document US 2013/0037717 A1 is hereby included by reference.

There are various manufacturing methods for the shielding elements 61, 62, 63.

Planar shielding layer stacks can be manufactured in various ways, for example by physical vapor deposition like sputtering or evaporation, by chemical vapor deposition, by atomic layer deposition, by electroplating, by chemical plating, by plasma spraying, by mechanical cladding and/or by diffusion welding, or also by LIGA methods based on lithography, electroplating and molding, wherein LIGA stands for 'Lithographie, Galvanoformung, Abformung'. Mechanical cladding describes the joining of two or more different high purity metal foils under high pressure, for example by means of a roller or a press. Diffusion welding or bonding describes a similar process with additional application of elevated temperatures of typically a few hundred degrees Celsius, wherein intermetallic bonds are strengthened by interspersion of interface atoms over time.

It is also possible to combine layers of different materials and structures by attaching to one another, for example, by the above described methods as gluing, welding, soldering, brazing, rolling and/or diffusion bonding. For example, it is possible to form an aligned and matched shielding element by gluing metal layers to ceramic substrates all having defined thicknesses.

The described planar shielding layer stacks can further be modified by laser processing, wire cutting, milling or etching. Thus, it is possible to shape the contour of a shielding element as well as to provide the contour line with an angle between the top and bottom sides of the shielding element. In some cases it might be advantageous to first shape the core shielding material using a method described above and then to deposit the consecutive shielding layers.

It is also possible to implement three-dimensional shielding elements 61, 62, 63, for example, in order to take account of a topology of the device interior or to further improve the shielding efficiency. Three-dimensional shielding elements 61, 62, 63 could be manufactured, for example, from planar shielding elements by bending, stamping, punching, pressing, deep drawing, machining or the like.

Figure 20:
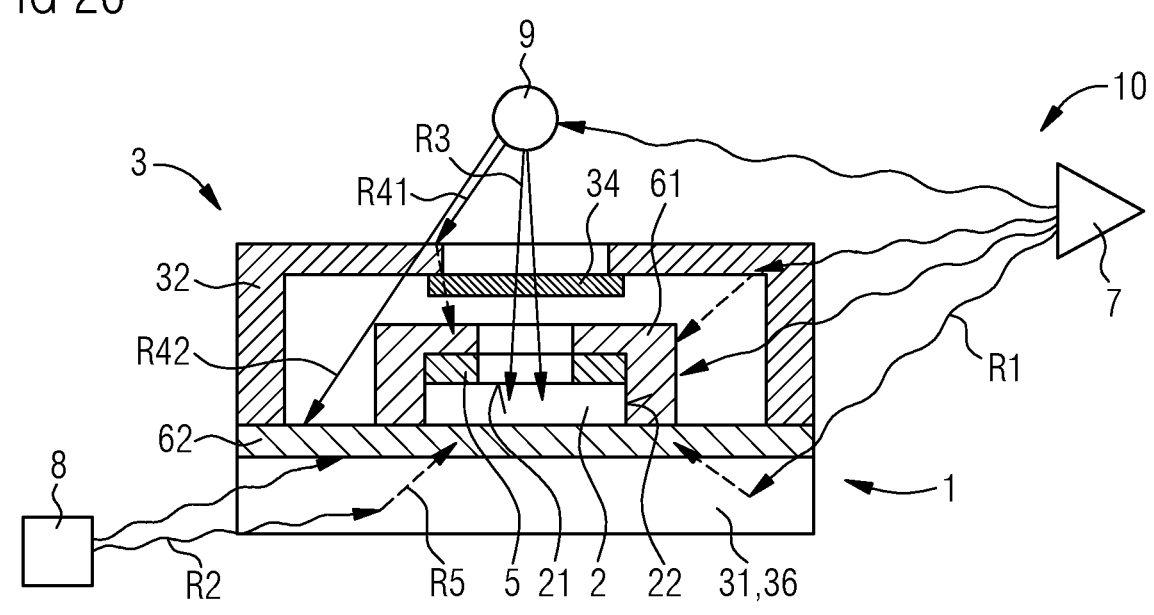
FIG. 20 shows a schematic cross-sectional view of an exemplary embodiment of an analyzer system comprising an X-ray detection device described herein.

Finally, in FIG. 20 an X-ray fluorescence analyzer system 10 is shown, which illustrates an exemplary application of the X-ray detection device 1. The X-ray detection device 1 could be any one of the previously described devices 1. Further, the system 10 comprises an excitation source 7 which provides, for example, X-rays R1 to excite a sample 9 to be analyzed so that the sample 9 emits X-ray fluorescence R3, R41, R42. Moreover, there can be at least one natural or artificial background source 8 also causing X-rays R2 to impinge on the device 1.

Especially the collimator 5 is used to allow only the X-rays R3 from the sample 9 to hit the detector 2. However, the X-rays 41 may hit the housing 3 and may cause stray X-rays R5, which is also possible for the X-rays R1, R2. The stray X-rays R5 may have a different energy or energy distribution or intensity than the original X-rays R1, R2, R41. These stray X-rays R5 can be shielded from the detector 2 by means of the shielding elements 61, 62, 63. The original X-rays R41, R1, R2 may also be absorbed by the shielding elements 61, 62, 63, wherein the shielding elements 61, 62, 63 are, for example, configured as multi-layer stacks so that the shielding elements 61, 62, 63 either do not lead or negligibly lead to X-ray fluorescence within the energy detection range of the detector 2, or cause the intensity of the X-rays to decrease below a detection limit for the respective measurement scenario or at least below a limit which does not affect an elemental analysis for the respective application any more.

Thus, the shielding elements 61, 62, 63 are configured to provide at least one of protection of the X-ray detector 2 against stray X-rays R5 within the energy detection range coming from the housing 3 and possibly also from the collimator 5, or protection of the housing 3 and possibly also of the collimator 5 from at least one of the stray X-rays R5 or the other X-rays R1, R2 not coming from the sample 9 or the other X-rays R41, R42 coming from the sample 9 but possibly causing the stray X-rays R5.

Otherwise, the same as to FIGS. 1 to 19 may also apply to FIG. 20, and vice versa.

Figure 21:
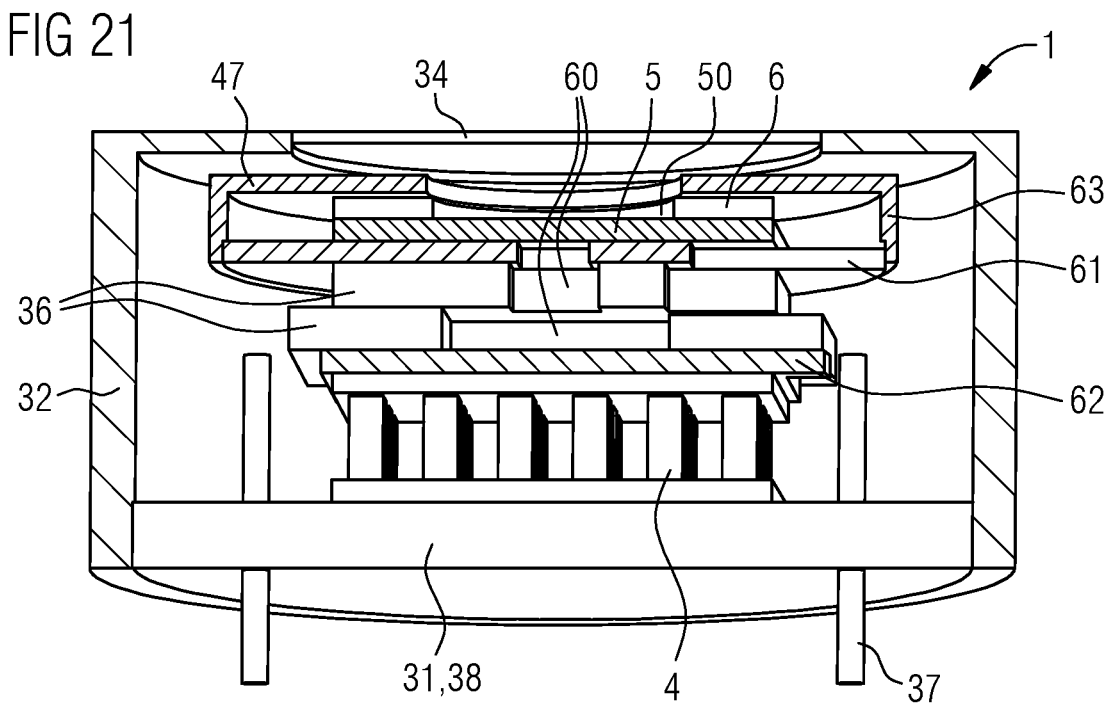
FIGS. 21 and 22 show schematic perspective cross-sectional views of exemplary embodiments of X-ray detection devices described herein.

In FIG. 21 it is illustrated that the additional shielding element 63 is limited to an area of the shielding element 61 remote from the socket 31, 38, that is, the additional shielding element 63 may be present only on a side of the shielding element 61 remote from the circuit board 36. Hence, the shielding elements 61, 63 form a cavity in which the detector 2 is located. By means of this arrangement of the shielding elements 61, 63, especially stray X-rays form the cap 32 can be reduced. Hence, radiation coming from above and not coming through the openings 50, 60 have to travel through the collimator 5 and the shielding elements 61, 63, respectively, and consequently that radiation's intensity reaching the detector 2 is fully blocked or at least partially reduced.

Because the additional shielding element 63 is particularly to shield the detector 20 from stray X-rays from the cap 32, the additional shielding element 63 can have a different material composition and/or layer sequence than the first and second shielding elements 61, 62 which are to protect the detector 2 from radiation from the circuit board 36 and the cooling unit 4, for example. Thus, the additional shielding element 63 may be designed to absorb characteristic X-rays from the cap 32 and may be, for example, of Ni.

The additional shielding element 63 may be mounted on the first shielding element 61 only, for example, and can thus be distant from the cap 32.

Figure 22:
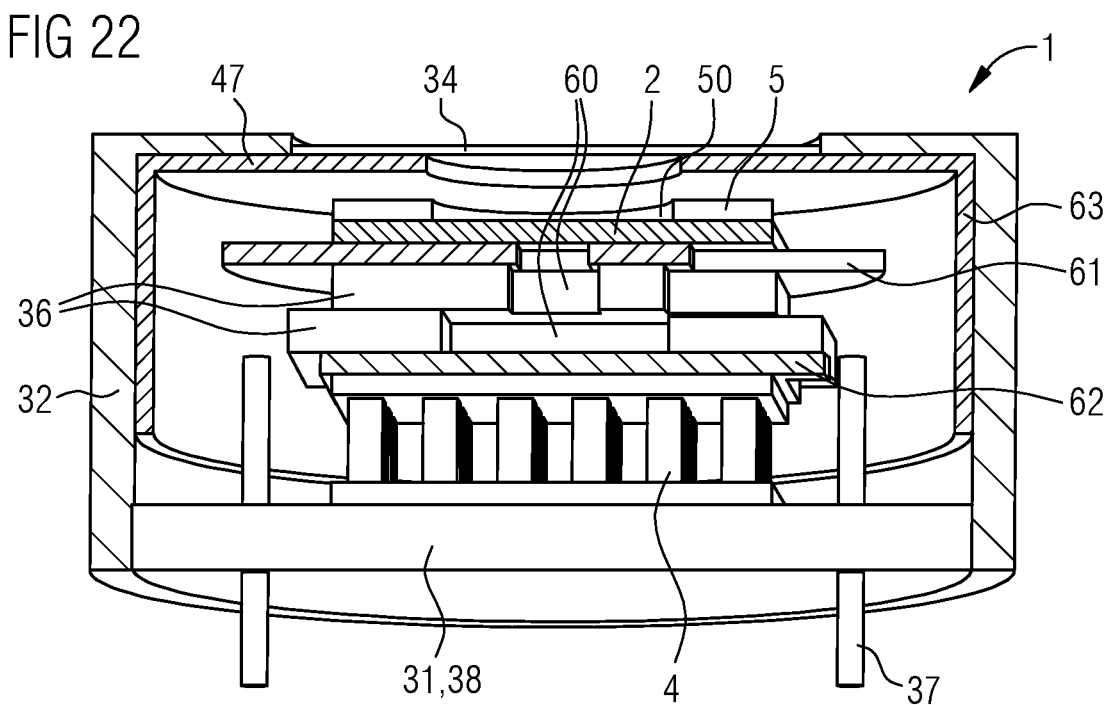

In FIG. 22 it is illustrated that the additional shielding element 63 is mounted on interior faces of the cap 32 and, thus, may touch the cap 32 all around. For example, the additional shielding element 63 is a coating applied on the interior faces of the cap 32 or the additional shielding element 63 is a ferrule inserted in the cap 32.

The top side 47 may also touch the cap 32 and/or the window 34. However, other than shown in FIG. 22 the top side 47 may be distant from the window 34. Optionally, if the top side 47 is present, the opening in the top side 47 may be smaller than the window 34. The additional shielding element 63 may be distant from the first and second shielding elements 61, 62 and/or from the collimator 5. Other than shown in FIG. 22, the additional shielding element 63 may also touch the first shielding element 61, analogously to FIG. 12 or 21, for example.

Thus, the additional shielding element 63 may be mounted on the inward faces of the cap 32 and/or on a top side of the cap 32 and/or on the window 34, like on a frame of the window 34, not shown.

Such an additional shielding element 63 as illustrated in FIGS. 21 and 22 may alternatively or additionally also be present in the embodiments of FIG. 1 to 14, 17 or 20, for example.

Otherwise, the same as to FIGS. 1 to 20 may also apply to FIGS. 21 and 22, and vice versa.

The components shown in the figures follow, unless indicated otherwise, exemplarily in the specified sequence directly one on top of the other. Components which are not in contact in the figures are exemplarily spaced apart from one another. If lines are drawn parallel to one another, the corresponding surfaces may be oriented in parallel with one another. Likewise, unless indicated otherwise, the positions of the drawn components relative to one another are correctly reproduced in the figures.

The term 'and/or' describes only an association relationship for describing associated objects and represents that three relationships may exist. For example, A and/or B may represent the following three cases: Only A exists, both A and B exist, and only B exists. Correspondingly, the wording 'at least one of A, B or C' may represent the following seven cases: Only A exists, only B exists, only C exists, both A and B exist, both A and C exist, both B and C exist, as well as all three A and B and C exist; the same applies analogously if there are only two or more than three entities in the list following 'at least one of'. Thus, 'at least one of A or B' is equivalent to 'A and/or B'.

The invention described here is not restricted by the description on the basis of the exemplary embodiments.

Rather, the invention encompasses any new feature and also any combination of features, which includes in particular any combination of features in the patent claims, even if this feature or this combination itself is not explicitly specified in the patent claims or exemplary embodiments.

What is claimed is:

1. An X-ray detection device comprising:
a housing;
an X-ray detector located in the housing and configured to detect X-rays within an energy detection range of the X-ray detector;
a collimator being opaque in at least part of the energy detection range and partially covering the X-ray detector; and
a first shielding element being opaque in at least part of the energy detection range,
wherein the first shielding element is configured to provide at least one of:
a protection of the X-ray detector against stray X-rays within the energy detection range coming from the housing and/or from the collimator, or
a protection of the housing and/or the collimator from at least one of the stray X-rays or other X-rays,
wherein the housing comprises a cap and at least one of a socket, a circuit board, a spacer or a cooling unit, the X-ray detector being mounted on the at least one of the socket, the circuit board or the spacer,
wherein the cap comprises an opening and a window closing the opening so that an enclosed space is encased by the cap together with at least one of the socket, the spacer, the cooling unit or the circuit board,
wherein the X-ray detector is located in the enclosed space,
wherein the first shielding element is located between the X-ray detector and the at least one of the socket, the circuit board, the spacer or the cooling unit,
wherein the first shielding element has a centrally located shielding element opening and the at least one of the socket, the spacer, the cooling unit or the circuit board has a board opening,
wherein the board opening and the shielding element opening overlap at least partially, and
wherein the shielding element opening protrudes into the board opening, seen in top view of the X-ray detector.

2. The X-ray detection device according to claim 1, wherein the stray X-rays originate from the housing upon being hit by at least one of the X-rays to be detected or the other X-rays.

3. The X-ray detection device according to claim 1, wherein a transmittance of the first shielding element for X-ray photons with energies below 30 keV is 5% or less.

4. The X-ray detection device according to claim 1, wherein the X-ray detector is a silicon drift detector.

5. The X-ray detection device according to claim 1, wherein a thickness of the first shielding element is between 0.01 mm and 2 mm, inclusive.

6. The X-ray detection device according to claim 1, wherein the first shielding element is of a single material selected from the following group: Al, C, Au, Bi, Pt, Sn, In, Sb, Ag, Fe, Cr, V, Co, Rh, Te, Ti, Cu, Mo, Ni, Pd, Ta, W, Zr, Zn, sapphire or parylenes.

7. The X-ray detection device according to claim 1, wherein the first shielding element comprises a plurality of different materials, the different materials are arranged in the first shielding element so that an atomic number or an average atomic number of the different materials decreases in a direction towards the X-ray detector and/or in a direction away from a center of the first shielding element, and
wherein the first shielding element comprises at least two materials selected from the following group: Al, C, Au, Bi, Pt, Sn, In, Sb, Ag, Fe, Cr, V, Co, Rh, Te, Ti, Cu, Mo, Ni, Pd, Ta, W, Zr, Zn, sapphire or parylenes.

8. The X-ray detection device according to claim 1, wherein the first shielding element and the collimator are at least one of different material compositions or of different layer thicknesses or of different layer sequences.

9. The X-ray detection device according to claim 1, wherein the first shielding element is located between the window and the collimator.

10. The X-ray detection device according to claim 9, wherein the first shielding element is mounted on an interior side of the cap facing the collimator and is distant from the collimator.

11. The X-ray detection device according to claim 9, wherein the first shielding element is mounted on a side of the collimator facing the window and is distant from the cap.

12. The X-ray detection device according to claim 1, further comprising:
a second shielding element,
wherein the second shielding element is located on a side of the first shielding element remote from the X-ray detector and distant from the first shielding element,
wherein, seen in top view of the X-ray detector, the second shielding element completely extends across the shielding element opening.

13. The X-ray detection device according to claim 1, further comprising:
a second shielding element,
wherein the first shielding element is located between the X-ray detector and the at least one of the socket, the spacer, the cooling unit or the circuit board, and
wherein the second shielding element is located within the at least one of the socket, the spacer, the cooling unit or the circuit board and is distant from the X-ray detector.

14. The X-ray detection device according to claim 1, wherein the first shielding element at least partially covers side faces of the X-ray detector.

15. An X-ray detection device comprising:
a housing including at least one of a socket, a spacer board, a cooling unit or a circuit board;
an X-ray detector located in the housing and configured to detect X-rays within an energy detection range of the X-ray detector;
a collimator being opaque in at least part of the energy detection range and partially covering the X-ray detector and being located in the housing; and
a first shielding element and a second shielding element being opaque in at least part of the energy detection range and being located in the housing,
wherein the first shielding element is located between the X-ray detector and at least one of the socket, the spacer board, the cooling unit or the circuit board,
wherein the second shielding element is located within at least one of the socket, the spacer board, the cooling unit or the circuit board and is distant from the first shielding element, and
wherein the first shielding element and the second shielding element have different base areas, seen in top view of the X-ray detector.

16. An X-ray detection device comprising:

a housing including a cap and at least one of a socket, a spacer board, a cooling unit or a circuit board;

an X-ray detector located in the housing and configured to detect X-rays within an energy detection range of the X-ray detector;

a collimator being opaque in at least part of the energy detection range and partially covering the X-ray detector and being located in the housing; and a first shielding element and a second shielding element being opaque in at least part of the energy detection range and being located in the housing, wherein the first shielding element is located between the X-ray detector and at least one of the socket, the spacer board, the cooling unit or the circuit board or is located within at least one of the socket, the spacer board, the cooling unit or the circuit board and is distant from the second shielding element, wherein the second shielding element at least partially covers side faces of the X-ray detector and of at least one of the socket, the spacer board, the cooling unit or the circuit board, and wherein the second shielding element is attached to at least one of the collimator, cap, the first shielding element, the socket, the spacer board, the cooling unit, the circuit board or the X-ray detector.

17. An X-ray detection device comprising:

a housing;

an X-ray detector located in the housing and configured to detect X-rays within an energy detection range of the X-ray detector;

a collimator being opaque in at least part of the energy detection range and partially covering the X-ray detector; and a shielding element being opaque in at least part of the energy detection range, wherein the shielding element is configured to provide at least one of:

a protection of the X-ray detector against stray X-rays within the energy detection range coming from the housing and/or from the collimator, or a protection of the housing and/or the collimator from at least one of the stray X-rays or other X-rays, wherein the housing comprises a cap and at least one of a socket, a circuit board, a spacer or a cooling unit, the X-ray detector being mounted on the at least one of the socket, the circuit board or the spacer, wherein the cap comprises an opening and a window closing the opening so that an enclosed space is encased by the cap together with at least one of the socket, the spacer, the cooling unit or the circuit board, wherein the X-ray detector is located in the enclosed space, wherein the shielding element is located at or within the at least one of the socket and the circuit board and is distant from the X-ray detector, wherein the housing further comprises the cooling unit on a side of the at least one of the socket and the circuit board remote from the X-ray detector, and wherein the shielding element extends for at least 80 percent of an overall area of the at least one of a detection region of the X-ray detector, the socket, the spacer, the cooling unit, or the circuit board, wherein the circuit board is arranged over the at least one of the socket, the spacer, the cooling unit or the circuit board, seen in top view of the X-ray detector.

18. An X-ray detection device comprising:

a housing;

an X-ray detector located in the housing and configured to detect X-rays within an energy detection range of the X-ray detector;

a collimator being opaque in at least part of the energy detection range and partially covering the X-ray detector; and a first shielding element being opaque in at least part of the energy detection range, wherein the first shielding element is configured to provide at least one of:

a protection of the X-ray detector against stray X-rays within the energy detection range coming from the housing and/or from the collimator, or a protection of the housing and/or the collimator from at least one of the stray X-rays or other X-rays, wherein the housing comprises a cap and at least one of a socket, a circuit board, a spacer or a cooling unit, the X-ray detector being mounted on the at least one of the socket, the circuit board or the spacer, wherein the cap comprises an opening and a window closing the opening so that an enclosed space is encased by the cap together with at least one of the socket, the spacer, the cooling unit or the circuit board, wherein the X-ray detector is located in the enclosed space, wherein the X-ray detection further comprises a second shielding element, wherein the first shielding element is located between the X-ray detector and the at least one of the socket, the spacer, the cooling unit or the circuit board, and wherein the second shielding element is located within the at least one of the socket, the spacer, the cooling unit or the circuit board and is distant from the X-ray detector.

\* \* \* \* \*